(12) United States Patent
Ishiga et al.

(10) Patent No.: US 10,128,270 B2
(45) Date of Patent: Nov. 13, 2018

(54) ACTIVE MATRIX SUBSTRATE AND MANUFACTURING METHOD OF THE SAME

(71) Applicant: Mitsubishi Electric Corporation, Tokyo (JP)

(72) Inventors: Nobuaki Ishiga, Kumamoto (JP); Kazunori Inoue, Kumamoto (JP); Naoki Tsumura, Kumamoto (JP); Kensuke Nagayama, Kumamoto (JP); Yasuyoshi Ito, Kumamoto (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/354,217

(22) Filed: Nov. 17, 2016

(65) Prior Publication Data

US 2017/0069665 A1 Mar. 9, 2017

Related U.S. Application Data

(62) Division of application No. 14/311,661, filed on Jun. 23, 2014.

(30) Foreign Application Priority Data

Jun. 27, 2013 (JP) .................................. 2013-134433

(51) Int. Cl.
*H01L 27/12* (2006.01)
*H01L 21/027* (2006.01)
(Continued)

(52) U.S. Cl.
CPC ...... *H01L 27/1225* (2013.01); *H01L 21/0273* (2013.01); *H01L 21/47573* (2013.01);
(Continued)

(58) Field of Classification Search
CPC .............. H01L 27/1225; H01L 27/124; H01L 27/1288; H01L 27/3248; H01L 27/3276; G02F 1/134363
See application file for complete search history.

(56) References Cited

U.S. PATENT DOCUMENTS

| 4,918,504 A | 4/1990 | Kato et al. |
| 5,198,377 A | 3/1993 | Kato et al. |

(Continued)

FOREIGN PATENT DOCUMENTS

| CN | 102629590 A | 8/2012 |
| JP | S64-035529 A | 2/1989 |

(Continued)

OTHER PUBLICATIONS

Mammana et al. (2012). Etching of thin films of ITO in oxalic acid.*
(Continued)

*Primary Examiner* — Lauren R Bell
(74) *Attorney, Agent, or Firm* — Studebaker & Brackett PC

(57) ABSTRACT

The present disclosure relates to a method for manufacturing an active matrix substrate. A first laminated film in which a semiconductor film, a first transparent conductive film, and a first metal film are laminated is formed on a substrate. A photoresist pattern having a first part covering a formation area of a channel part of a thin film transistor, a second part covering a formation area of a pixel electrode, and a third part covering formation areas of a source electrode, a drain electrode, and a source line, is formed on the first laminated film. The first metal film, the first transparent conductive film, and the semiconductor film are patterned using the photoresist pattern; the first part is removed and the first (Continued)

metal film and the first transparent conductive film are patterned; and the second part is removed and the first metal film is patterned.

12 Claims, 26 Drawing Sheets

(51) Int. Cl.
H01L 21/4757 (2006.01)
H01L 21/4763 (2006.01)
H01L 29/45 (2006.01)
H01L 29/66 (2006.01)
H01L 29/786 (2006.01)

(52) U.S. Cl.
CPC ...... H01L 21/47635 (2013.01); H01L 27/124 (2013.01); H01L 27/1288 (2013.01); H01L 29/45 (2013.01); H01L 29/66969 (2013.01); H01L 29/7869 (2013.01)

(56) References Cited

U.S. PATENT DOCUMENTS

| | | |
|---|---|---|
| 6,449,026 B1 | 9/2002 | Min et al. |
| 6,468,840 B2 | 10/2002 | Tanaka et al. |
| 6,485,997 B2 | 11/2002 | Lee et al. |
| 6,563,174 B2 | 5/2003 | Kawasaki et al. |
| 6,800,872 B2 | 10/2004 | Tanaka et al. |
| 7,061,014 B2 | 6/2006 | Hosono et al. |
| 7,259,045 B2 | 8/2007 | Dejima |
| 7,763,490 B2 | 7/2010 | Dejima |
| 7,790,483 B2 | 9/2010 | Miyairi et al. |
| 8,263,977 B2 | 9/2012 | Inoue et al. |
| 8,268,654 B2 | 9/2012 | Fujikawa et al. |
| 8,603,843 B2 | 12/2013 | Song et al. |
| 8,778,722 B2 | 7/2014 | Inoue et al. |
| 8,928,122 B2 | 1/2015 | Nagano et al. |
| 9,240,424 B2 | 1/2016 | Ning et al. |
| 2006/0139548 A1* | 6/2006 | Ahn ................ G02F 1/134363 349/141 |
| 2008/0042134 A1 | 2/2008 | Jung et al. |
| 2009/0134399 A1 | 5/2009 | Sakakura et al. |
| 2009/0289257 A1* | 11/2009 | Sakurai .................. G03F 1/36 257/59 |
| 2009/0311809 A1 | 12/2009 | Miyairi et al. |
| 2010/0107982 A1 | 5/2010 | Song et al. |
| 2010/0283055 A1 | 11/2010 | Inoue et al. |
| 2012/0009725 A1 | 1/2012 | Inoue et al. |
| 2012/0133856 A1 | 5/2012 | Ono |
| 2012/0329186 A1 | 12/2012 | Fujikawa et al. |
| 2013/0056737 A1* | 3/2013 | Fujiwara ............ H01L 29/458 257/59 |
| 2013/0113109 A1 | 5/2013 | Nagano et al. |
| 2013/0161609 A1* | 6/2013 | Koyama .......... H01L 29/66969 257/43 |
| 2014/0117372 A1 | 5/2014 | Ning et al. |

FOREIGN PATENT DOCUMENTS

| | | |
|---|---|---|
| JP | 2001-056474 A | 2/2001 |
| JP | 2001-235763 A | 8/2001 |
| JP | 2001-311965 A | 11/2001 |
| JP | 2004-103957 A | 4/2004 |
| JP | 2004-281687 A | 10/2004 |
| JP | 2005-077822 A | 3/2005 |
| JP | 2008-072011 A | 3/2008 |
| JP | 2009-157366 A | 7/2009 |
| JP | 2010-028103 A | 2/2010 |
| JP | 2010-118407 A | 5/2010 |
| JP | 2011-205119 A | 10/2011 |
| JP | 2013-101232 A | 5/2013 |
| JP | 2013-525849 A | 6/2013 |
| WO | 2011/063966 A1 | 6/2007 |

OTHER PUBLICATIONS

An Office Action; "Notification of Reason(s) for Refusal," issued by the Japanese Patent Office dated Mar. 28, 2017, which corresponds to Japanese Patent Application No. 2013-134433 and is related to U.S. Appl. No. 5/354,217; with English language translation.

Kenji Nomura et al.; "Room-temperature fabrication of transparent flexible thin-film transistors using amorphous oxide semiconductors"; Nature; vol. 432 (2004); p. 488-492.

* cited by examiner

F I G . 2
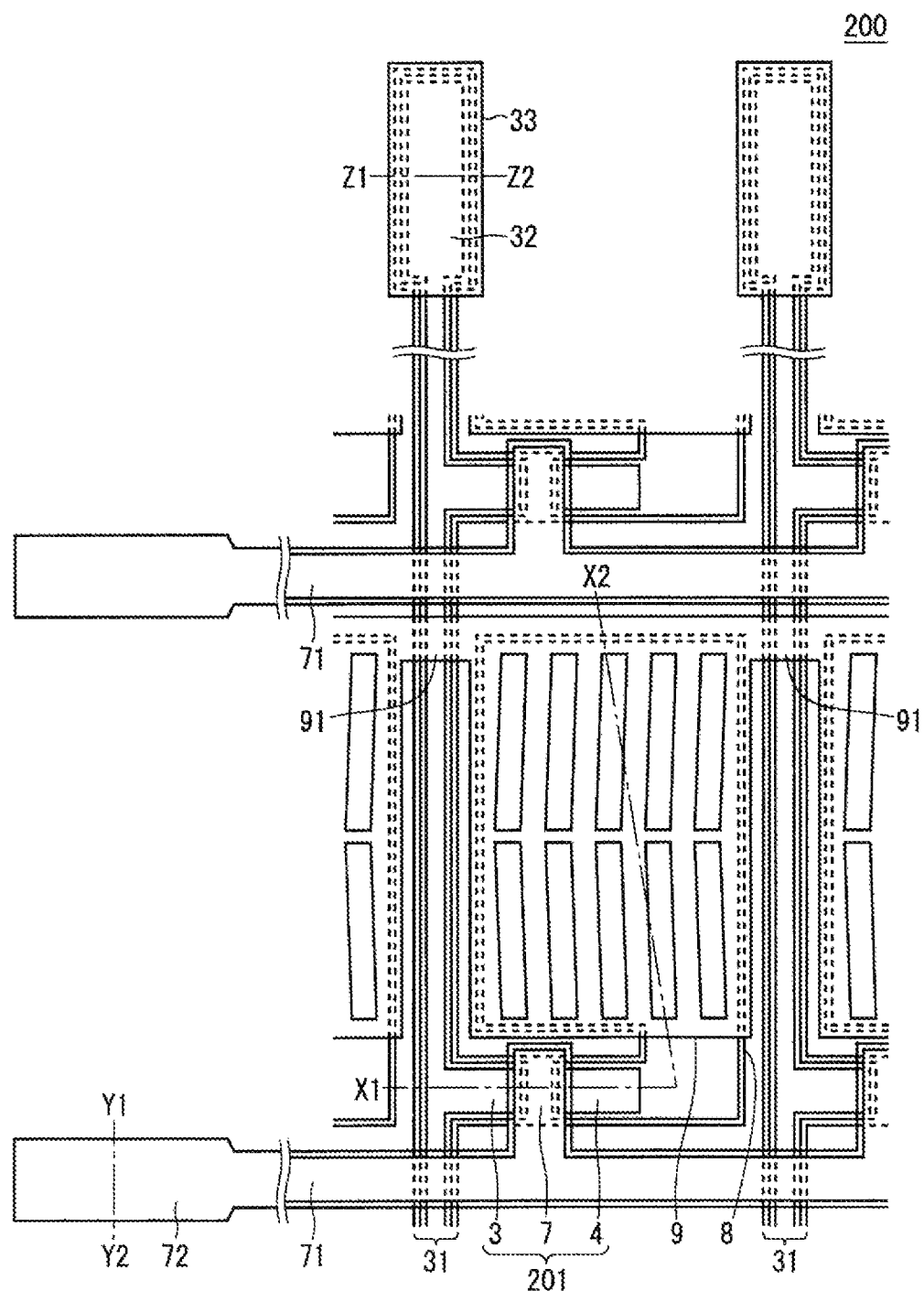

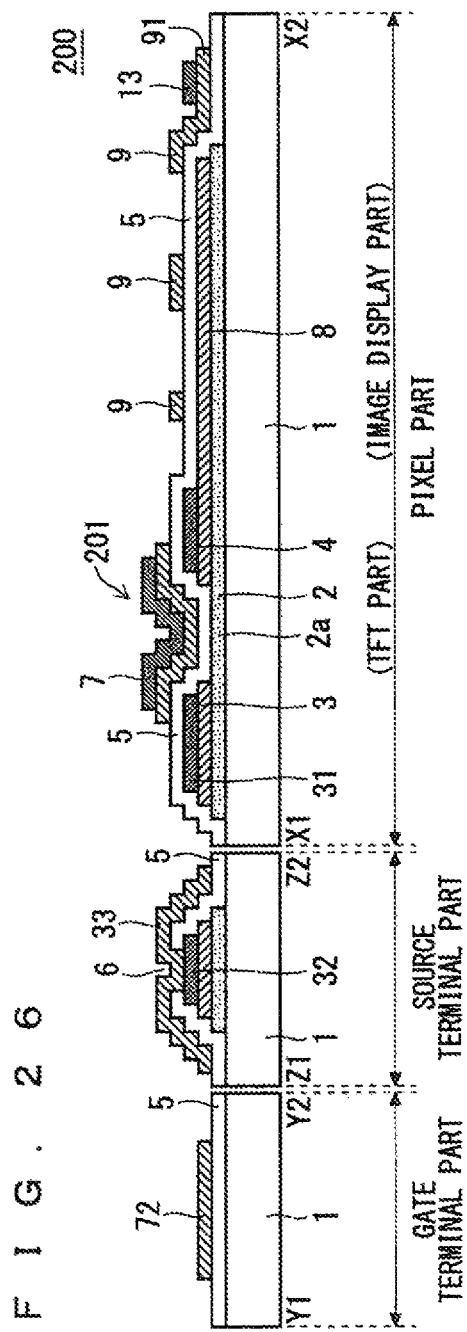

ACTIVE MATRIX SUBSTRATE AND MANUFACTURING METHOD OF THE SAME

CROSS-REFERENCE TO RELATED APPLICATIONS

The present application is a Divisional application of U.S. patent application Ser. No. 14/311,661 filed Jun. 23, 2014, which claims priority from Japanese Patent Application No. 2013-134433 filed Jun. 27, 2013, the contents of which are all herein incorporated by reference in their entirety.

BACKGROUND OF THE INVENTION

Field of the Invention

The present invention relates to an active matrix substrate used for a display device and the like and relates to a manufacturing method of the active matrix substrate.

Description of the Background Art

An active matrix substrate which uses thin film transistors (TFT) as switching elements (hereinafter, referred to as a "TFT substrate") is widely known as one used for an electro-optical device, for example, a display device which uses liquid crystal (hereinafter, referred to as a "liquid crystal display device") and the like. With respect to electro-optical devices using TFT substrates, the display performance is required to be improved (a higher definition, a higher quality, and the like), and cost is required to be reduced by simplifying a production process and producing efficiently.

Conventionally, as switching elements in a TFT substrate for a liquid crystal display device, a back-channel type TFT is widely used. In the back-channel type TFT for a liquid crystal display device, amorphous silicon (Si) is used for a semiconductor active layer, and the back-channel type TFT is generally made in an element structure called a "reverse stagger type." A TFT substrate equipped with reverse stagger type TFTs is usually manufactured through four to five photoengraving processes (photolithography processes).

Alternatively, from the point of view of simplifying a production process of a TFT substrate, a manufacturing method is disclosed in, for example, Japanese Patent Application Laid-Open No. S64-35529 (Japanese Patent Application Laid-Open No. H1-35529), No. 2001-056474, and No. 2004-281687 (Japanese Patent No. 4522660), in which manufacturing method TFTs having an element structure called a "stagger type" are used as switching elements, and three photolithography processes are used to form the TFT substrate.

On the other hand, from the viewpoint of display performance, a technology has been developed in which an oxide semiconductor having higher mobility than the conventional Si is used for an active layer of the TFT (for example, see Japanese Patent Application Laid-Open No. 2004-103957 (Japanese Patent No. 4164562) and No. 2005-77822 and Nature Vol. 432 (2004) p. 488). As an oxide semiconductor, research and development are conducted focusing around a zinc oxide (ZnO)-based oxide semiconductor and an IGZO-based oxide semiconductor in which gallium oxide ($Ga_2O_3$) and indium oxide ($In_2O_3$) are added to zinc oxide (ZnO).

The above-described oxide semiconductors can be etched with a weak acid solution such as oxalic acid and carboxylic acid, which provides an advantage to be easily patterned. However, the above-described oxide semiconductors are easily dissolved with acid-based solutions which are usually used in etching processes of common metal films (Cr, Ti, Mo, Ta, Al, Cu, and an alloy of them) used for source electrodes and drain electrodes of TFTs. For this reason, in the case of forming a TFT having an active layer of an oxide semiconductor, it is necessary that a new element is added to the oxide semiconductor to improve chemical resistance and that film thicknesses of the metal film and the oxide semiconductor are optimized such that the oxide semiconductor as the active layer does not disappear when the metal film as the source electrode and the drain electrode is etched (patterned) as described in, for example, Japanese Patent Application Laid-Open No. 2008-72011.

Since the FFS (Fringe Field Switching) type liquid crystal display panel disclosed in Japanese Patent Application Laid-Open No. 2001-056474 has excellent field-of-view characteristics and transmittance of the panel, demand for the panel is increasing. However, in the FFS type liquid crystal display panel, pixel electrodes and an opposite electrode (common electrode) for generating electric fields to drive liquid crystal are both required to be formed on the TFT substrate, whereby the number of the wiring layers on the TFT substrate is increased. Thus, the number of photolithography processes needed to form the TFT substrate is increased, thereby increasing production cost. For example, the TFT substrate having the structure shown in FIG. 1 and FIG. 3 of the Japanese Patent Application Laid-Open No. 2001-056474 is manufactured through six photolithography processes. For the TFT substrate of the conventional TN (Twisted Nematic) type, a manufacturing method with three photolithography processes is proposed as described above, and it is a big challenge in manufacturing the TFT substrate of the FFS type to reduce the number of photolithography processes (for example, Japanese Patent Application Laid-Open No. 2001-311965).

In order to solve the object, in Japanese Patent Application Laid-Open No. 2001-235763 and No. 2009-157366, methods are proposed in which the number of photolithography processes in manufacturing the TFT substrate of the FFS type is reduced to four to five. However, the number is still larger than that of the photolithography processes in manufacturing the TFT substrate of the TN type; thus, the production cost cannot be prevented from increasing.

SUMMARY OF THE INVENTION

The present invention has been made to solve the above-described problems, and an object of the present invention is to provide an active matrix substrate and a manufacturing method thereof in which the number of the photolithography processes in manufacturing can be reduced.

An active matrix substrate of the present invention is equipped with a thin film transistor. The thin film transistor includes a semiconductor film formed on a substrate, a source electrode and a drain electrode formed on the semiconductor film, a channel part which is a part of the semiconductor film and is exposed between the source electrode and the drain electrode, an insulation film covering the source electrode, the drain electrode, and the channel part, and a gate electrode disposed above the channel part with the insulation film interposed therebetween. The active matrix substrate further includes a pixel electrode connected to the drain electrode of the thin film transistor, a source line connected to the source electrode of the thin film transistor, and a gate line connected to the gate electrode of the thin film transistor. The source electrode, the drain electrode, and the source line include a conductive film of the same layer as the pixel electrode. A semiconductor layer of the same layer as the semiconductor film remains under the source line and the pixel electrode.

With the present invention, in manufacturing an active matrix substrate having thin film transistors, the number of photolithography processes can be reduced, and productivity can be improved, thereby achieving reduction in production cost. The present invention can also be applied to an active matrix substrate configured to use an oxide semiconductor for the semiconductor film (active layer) of the thin film transistor, and can also contribute to improvement of the performance of the active matrix substrate.

These and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a plan view of a TFT substrate according to a first preferred embodiment;

FIG. 26 is a cross sectional view of the TFT substrate according to the sixth preferred embodiment.

DESCRIPTION OF THE PREFERRED EMBODIMENTS

First Preferred Embodiment

Figure 1:
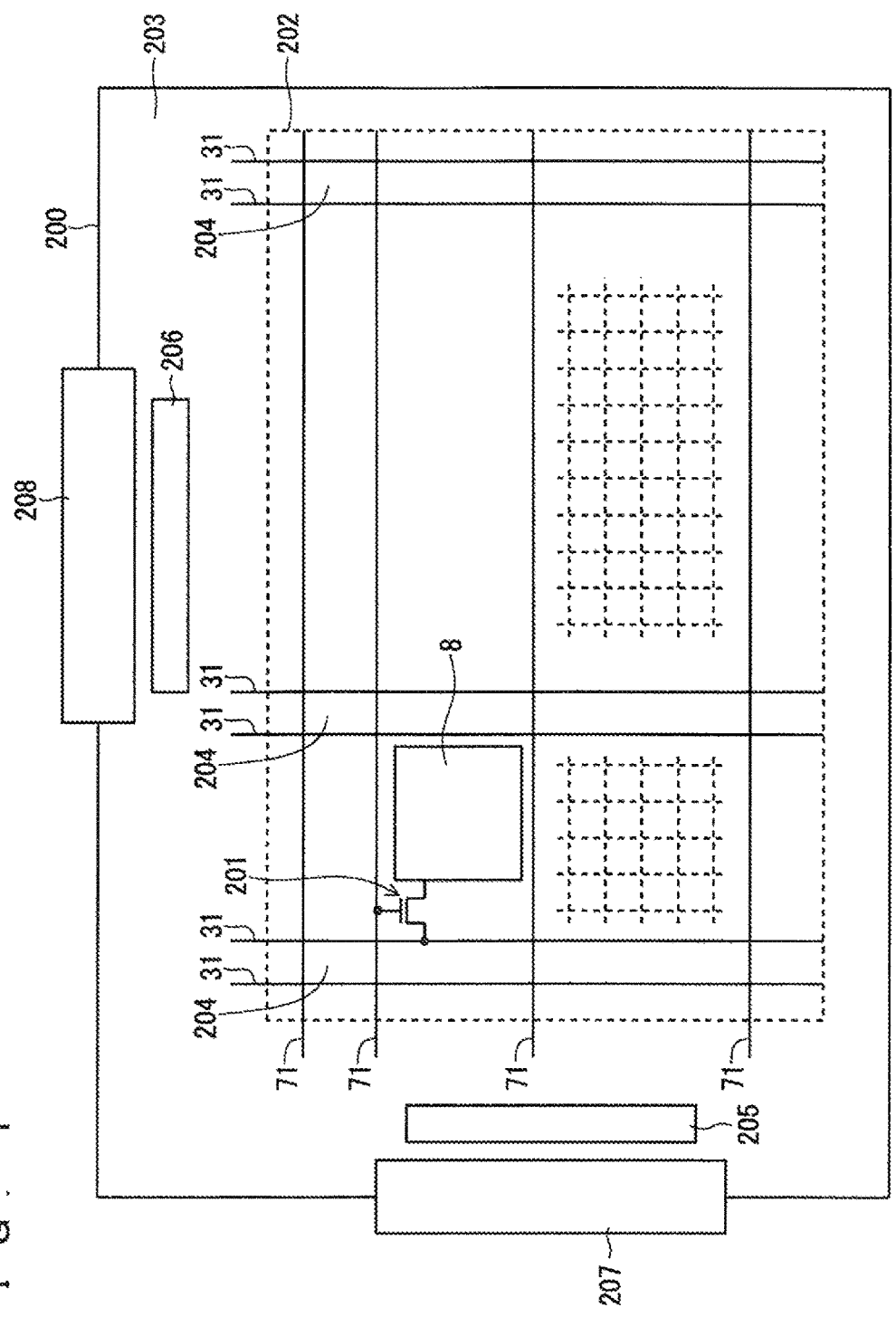
FIG. 1 is a plan view showing a configuration of a TFT substrate according to a preferred embodiment of the present invention.

FIG. 1 is a plan view showing a configuration of a TFT substrate according to a first preferred embodiment. The TFT substrate of the first preferred embodiment is an active matrix substrate in which a plurality of thin film transistors (TFTs) as switching elements are arranged in a matrix. Here, description will be made taking as an example the TFT substrate for a liquid crystal display (LCD) device which is a flat display device (flat panel display).

A TFT substrate 200 is divided into a display area 202 in which pixels 204 each having a TFT 201 are arranged in a matrix and a frame area 203 surrounding the display area 202.

In the display area 202, there are disposed a plurality of gate lines (scan signal lines) 71 and a plurality of source lines (display signal lines) 31. The plurality of gate lines 71 are arranged parallel to each other, and the plurality of source lines 31 are also arranged parallel to each other. The plurality of gate lines 71 and the plurality of source lines 31 cross over each other. In FIG. 1, the gate lines 71 extend in the horizontal direction, and the source lines 31 extend in the vertical direction. The area surrounded by adjacent gate lines 71 and adjacent source lines 31 is the pixel 204; thus, in the display area 202 the pixels 204 are arranged in a matrix.

In FIG. 1, one pixel 204 is illustrated in enlarged form as a typical example In the pixel 204, at least one TFT 201 is disposed. The TFT 201 is disposed in a vicinity of the intersection of the source line 31 and the gate line 71 and has a gate electrode connected to the gate line 71, a source electrode connected to the source line 31, and a drain electrode connected to a pixel electrode 8.

On the other hand, in the frame area 203 of the TFT substrate 200, there are provided a scan signal driving circuit 205 and a display signal driving circuit 206. Although not shown, the gate lines 71 are led from the display area 202 to the frame area 203 on the side where the scan signal driving circuit 205 is disposed, and are connected to the scan signal driving circuit 205. Similarly, the source lines 31 are led from the display area 202 to the frame area 203 on the side where the display signal driving circuit 206 is disposed, and are connected to the display signal driving circuit 206.

In a vicinity of the scan signal driving circuit 205, there are disposed external wiring lines 207 for connecting the scan signal driving circuit 205 to the outside, and in a vicinity of the display signal driving circuit 206, there are disposed external wiring lines 208 for connecting the display signal driving circuit 206 to the outside. These external wiring lines 207 and 208 are, for example, a wiring substrate such as an FPC (Flexible Printed Circuit) and the like.

Various types of control signals are supplied to the scan signal driving circuit 205 through the external wiring lines 207 from the outside, and various types of control signals and image data are supplied to the display signal driving circuit 206 through the external wiring lines 208 from the outside. The scan signal driving circuit 205 supplies, based on the control signals from the outside, gate signals (scan signals) to the gate lines 71. The gate signals sequentially select the gate lines 71 in a constant cycle. The display signal driving circuit 206 supplies, based on the control signals from the outside, display signals according to the image data to the source lines 31. By the operations of the scan signal driving circuit 205 and the display signal driving circuit 206, the display voltages according to the display signals are supplied to the pixels 204.

The scan signal driving circuit 205 and the display signal driving circuit 206 are not necessarily formed on the TFT substrate 200, and may be configured by using a TCP (Tape Carrier Package), for example, and be connected to the TFT substrate 200.

The TFTs 201 function as switching elements for supplying the display voltages to the pixel electrodes 8 and are on/off controlled by the gate signals supplied to the gate electrodes from the gate lines 71. When the TFT 201 is turned on, the display voltage supplied to the drain electrode from the source line 31 is applied to the pixel electrode 8, thereby generating an electric field according to the display voltage between the pixel electrode 8 and a common electrode (not shown).

In the case of a liquid crystal display device, an opposite substrate is disposed to face the TFT substrate 200. The opposite substrate is a color filter substrate, for example, and is disposed on the front side (viewing side) of the TFT substrate 200. On the opposite substrate, there are formed a color filter, a black matrix (BM), an alignment film, and the like. The alignment film may be formed also on the surface of the TFT substrate 200. In the case of a lateral-field-drive-type liquid crystal display device such as the FFS type, the common electrode is disposed not on the opposite substrate but on the TFT substrate 200.

The TFT substrate 200 and the opposite substrate are laminated with a certain gap (cell gap) being formed therebetween, and liquid crystal is filled and sealed in the gap to make a liquid crystal display panel. In other words, the liquid crystal display panel has a structure in which a liquid crystal layer is held between the TFT substrate 200 and the opposite substrate. In addition, on the outer surface of the liquid crystal display panel, there are provided a polarization plate, a phase difference plate, and the like. Further, on the backside of the liquid crystal display panel (the rear side of the TFT substrate 200), there is disposed a backlight unit.

Here, the operation of the liquid crystal display device will be briefly described. The liquid crystal held between the TFT substrate 200 and the opposite substrate is driven (the alignment direction is controlled) by the electric field generated between the pixel electrode 8 and the common electrode. When the alignment direction of the liquid crystal is changed, a polarization state of light passing though the liquid crystal is changed. Thus, the light which comes from the backlight unit and gets linearly polarized when passing through the polarization plate changes its polarization state when passing through the liquid crystal layer of the liquid crystal display panel. Specifically speaking, the light from the backlight unit is linearly polarized by the polarization plate on the side of the TFT substrate 200. Then, the polarization state of the linearly polarized light changes by passing through the liquid crystal layer.

The amount of light passing through the polarization plate on the opposite substrate side changes depending on the polarization state of the light having passed through the liquid crystal layer. That is, of the transmitted light coming from the backlight unit and passing through the liquid crystal display panel, the amount of the light passing through the polarization plate on the viewing side changes. The alignment direction of the liquid crystal changes depending on the display voltage applied to the pixel electrode 8. Thus, by controlling the display voltage, the amount of the light passing through the polarization plate on the viewing side can be controlled. In the liquid crystal display device, the display voltage applied to each pixel is controlled based on display data to display an intended image.

Figure 3:
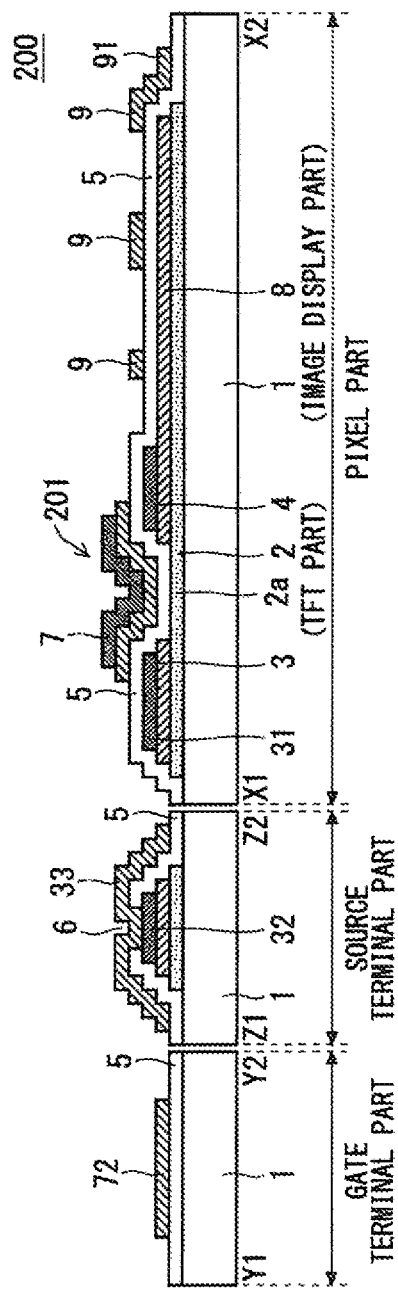
FIG. 3 is a cross sectional view of the TFT substrate according to the first preferred embodiment.

Next, with reference to FIG. 2 and FIG. 3, the more detailed configuration of the TFT substrate 200 according to the first preferred embodiment will be described. FIG. 2 is a diagram showing a plane structure of a main part including the pixel 204 on the TFT substrate 200 of the FFS type, and FIG. 3 is a diagram showing a cross sectional structure of the main part. FIG. 3 shows cross sectional views corresponding to line X1-X2, line Y1-Y2, and line Z1-Z2 shown in FIG. 2.

The cross section along line X1-X2 corresponds to a formation area (pixel part) of the pixel 204. The cross section along line Y1-Y2 corresponds to a formation area (gate terminal part) of a gate terminal 72 for supplying the gate signal to the gate line 71. The cross section along line Z1-Z2 corresponds to a formation area (source terminal part) of a source terminal 32 for applying the display signal to the source line 31 and a source terminal pad 33 provided on the source terminal 32.

Further, the cross section of the pixel part along line X1-X2 includes a "TFT part", which is a formation area of the TFT 201, and an "image display part", which is a formation area of the pixel electrode 8 and the common electrode 9, as shown in FIG. 3.

The TFT substrate 200 is formed of a substrate 1 which is a transparent insulation substrate such as glass and the like. On the substrate 1, there is formed a semiconductor film 2 constituting the active layer of the TFT 201, and on the semiconductor film 2, there are formed a source electrode 3 and a drain electrode 4 of the TFT 201. A part of the semiconductor film 2 exposed between the source electrode 3 and the drain electrode 4 is a channel part 2a of the TFT 201.

The source electrode 3 is formed to be connected to the source line 31, and the source terminal 32 is provided on an end part of the source line 31. The drain electrode 4 is connected to the pixel electrode 8 formed in the image display area.

As shown in FIG. 3, the source electrode 3, the drain electrode 4, the source line 31, and the source terminal 32 are made in a double-layer structure which includes the conductive film of the same layer as the pixel electrode 8 and the metal film thereon. Since the semiconductor film 2 basically constitutes the TFT 201, it is obvious that the semiconductor film 2 is disposed under the source electrode 3 and the drain electrode 4; however, in the TFT substrate 200 of the present preferred embodiment, the semiconductor layer of the same layer as the semiconductor film 2 remains under the source line 31 and the source terminal 32, and also under the pixel electrode 8.

An insulation film 5 is formed to cover the semiconductor film 2 (channel part 2a), the source electrode 3, the drain electrode 4, the pixel electrode 8, the source line 31, and the source terminal 32. Since the insulation film 5 functions as a gate insulation film in the TFT part, the insulation film 5 is hereinafter referred to as a "gate insulation film."

On the gate insulation film 5, there is formed a gate electrode 7 of the TFT 201 to overlap the channel part 2a. The gate electrode 7 is connected to the gate line 71 (not shown in FIG. 3), and on the end part of the gate line 71, the gate terminal 72 is provided. Further, in the image display part, the common electrode 9 is formed above the pixel electrode 8 with the gate insulation film 5 interposed therebetween. In addition, in the source terminal part, the source terminal pad 33 is formed to be electrically connected to the source terminal 32 through a contact hole 6 formed in the gate insulation film 5.

As shown in FIG. 3, the gate electrode 7 is formed in a double-layer structure which includes the conductive film of the same layer as the common electrode 9 and the metal film on the conductive film. Further, the gate terminal 72 and the source terminal pad 33 are formed of the conductive layer of the same layer as the common electrode 9. To the gate terminal 72, the scan signal is supplied from the scan signal driving circuit 205 shown in FIG. 1, and to the source terminal pad 33, the display signal is supplied from the display signal driving circuit 206 shown in FIG. 1.

In FIG. 2, the source lines 31 extend in the vertical direction, and the source electrodes 3 of the TFT 201 is formed to be connected to the source lines 31. That is, a part of the source line 31 which corresponds to the TFT part is the source electrode 3. In the example of FIG. 2, the parts which branch from the source lines 31 and extend to the TFT parts are the source electrodes 3.

On the other hand, the gate lines 71 extend in the horizontal direction in FIG. 2, and the gate electrodes 7 of the TFT 201 are formed to be connected to the gate lines 71. That is, the parts of the gate lines 71 which correspond to the TFT parts are the gate electrodes 7. With respect to the gate lines 71, the parts which are the gate electrodes 7 may be made wider than the other part; alternatively, as shown in FIG. 2, the parts branching from the gate lines 71 and extending to the TFT parts may be the gate electrodes 7.

Further, the pixel electrode 8 is a flat plate-like electrode and is formed to be connected to the lower layer of the drain electrode 4 in the double-layer structure. That is, a part of the pixel electrode 8 extends to the TFT part, and the part constitutes the lower layer of the drain electrode 4.

The common electrode 9 is an electrode in a comb shape having slits or a lattice shape and is disposed to face the pixel electrode 8 with the gate insulation film 5 interposed therebetween. The common electrode 9 is also connected partially to the common electrodes 9 of the pixels adjoining in the horizontal direction (extending direction of the gate electrode 7), and the common electrode 9 is supplied with a common potential through the common electrode 9 of the adjoining pixel. In other words, a part of the common electrode 9 is a common line 91 extending parallel to the gate line 71 (the common line 91 is formed of the conductive film of the same layer as the common electrode 9).

In the case of the TFT substrate 200 of the FFS type, most part of the pixel electrode 8 faces the common electrode 9 with only the gate insulation film 5 interposed therebetween, and a large storage capacitor is thus formed. For this reason, there is no need for providing a capacitor (auxiliary capacitor) besides the storage capacitor to hold the voltage of the pixel electrode 8.

Next, a manufacturing method of the TFT substrate 200 according to the first preferred embodiment will be described with reference to FIG. 4 to FIG. 20. FIG. 4 to FIG. 19 are cross sectional views each showing each process of the manufacturing method of the TFT substrate 200, and FIG. 20 is a plan view of the TFT substrate 200 in the middle of manufacturing. Note that in FIG. 4 to FIG. 20, the elements corresponding to the elements shown in FIG. 2 and FIG. 3 are assigned the same reference symbols as in FIG. 2 and FIG. 3.

Figure 4:
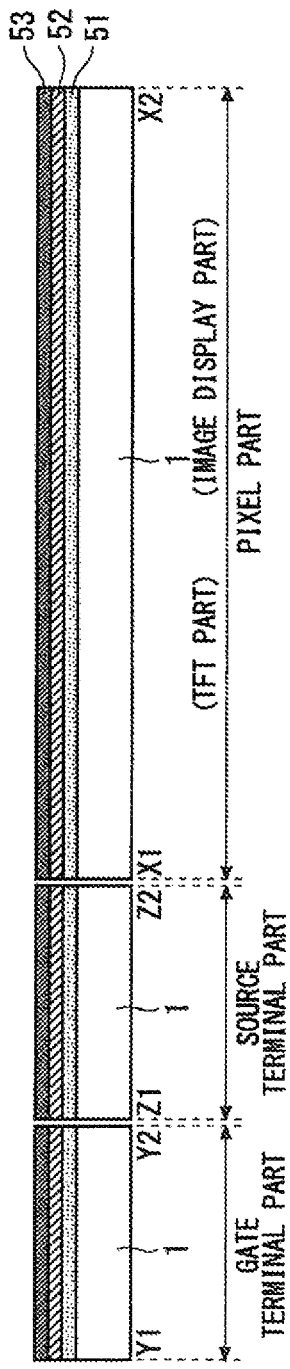
FIGS. 4 to 19 are views each showing a process of a manufacturing method of the TFT substrate according to the first preferred embodiment.

First, the surface of the substrate 1 is cleaned with cleaning liquid or pure water. As the substrate 1, a glass substrate with a thickness of 0.6 mm is used here. As shown in FIG. 4, on the substrate 1 having been cleaned, a laminated film (first laminated film) is formed in which an oxide semiconductor film 51 as material for the semiconductor film 2, a first transparent conductive film 52 as material for the pixel electrode 8, and a first metal film 53 as material for the source electrode 3 and the drain electrode 4 are formed in this order.

In the present preferred embodiment, the oxide semiconductor film 51 is deposited by using a sputtering method using an oxide semiconductor target having a non-crystal structure. Here, the oxide semiconductor target having an atomic composition ratio of In (indium):Ga (gallium):Zn (zinc):O (oxygen)=1:1:1:4. By the conventional sputtering process using Ar gas, an oxide film is sometimes deposited unintentionally which is in an oxygen-ion-deficient state (in the above example, the composition ration of O is less than 4) with the atomic composition ratio of oxygen smaller than the stoichiometry composition of O of the target. For this reason, it is preferable that the sputtering is performed with oxygen ($O_2$) gas added to the Ar gas. In the present preferred embodiment, the sputtering is performed using a mixed gas in which $O_2$ gas is added to Ar gas at a partial pressure percentage of 10%. The thickness of the oxide semiconductor film 51 is 50 nm.

The first transparent conductive film 52 is deposited by a sputtering method similar to the method for depositing the oxide semiconductor film 51. As a material can be used indium tin oxide (ITO), indium oxide zinc (IZO), and the like.

The first metal film 53 is made of an Al-3 mol % Ni alloy film with a thickness of 200 nm deposited by the sputtering method using Ar gas by using an Al-3 mol % Ni alloy target in which 3 mol % of Ni is added to Al. The first metal film 53 may be made in a laminated structure with a high-melting-point metal such as Mo/Al/Mo in consideration of contact resistance with the first transparent conductive film 52 and contact resistance with the source terminal pad 33 to be formed later.

Figure 5:
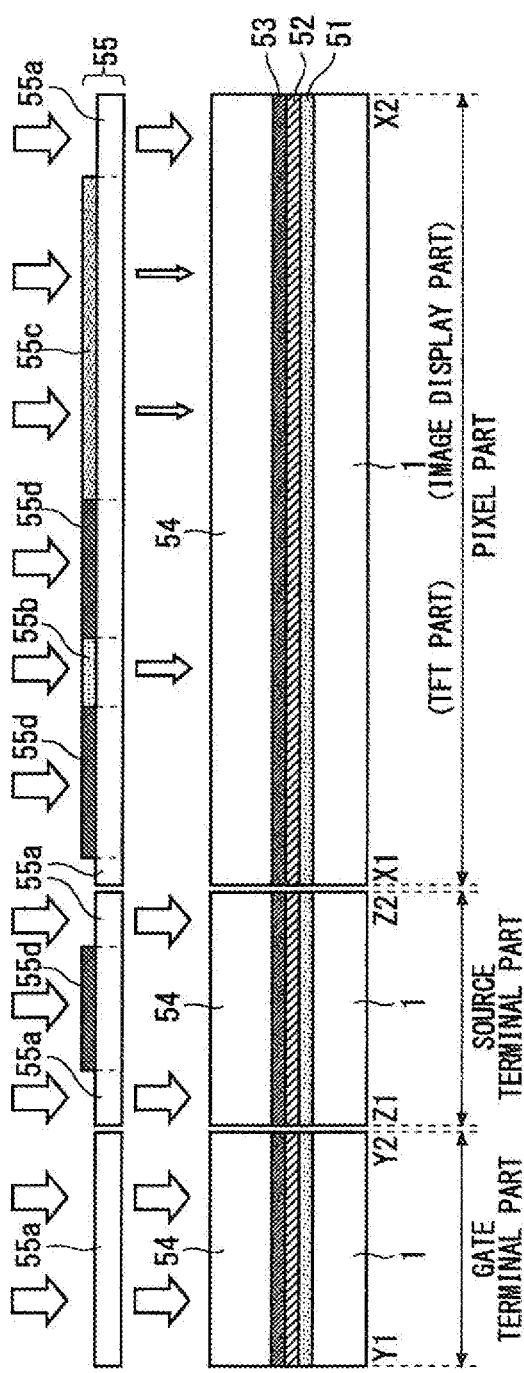

Then, a photoresist pattern is formed by the first photolithography process. First, a photoresist 54 is formed of a novolac-based positive photosensitive resin with a thickness of approximately 1.5 μm by using a coating method. Then, the photoresist 54 is exposed by using a photo mask 55 as shown in FIG. 5.

On the photo mask 55, there are formed light-shielding films corresponding to the patterns of the semiconductor film 2, the source electrode 3, the drain electrode 4, the pixel electrode 8, the source line 31, and the source terminal 32 of the TFT 201, and a part of the light-shielding film is a semi-transmissive film to reduce intensity of the exposure light. In addition, the semi-transmissive film includes two types of films having different transmittances. That is, the photo mask 55 has transmissive areas 55a in which no light-shielding film is provided, a first semi-transmissive area 55b in which a semi-transmissive film having a high transmittance is provided, a second semi-transmissive area 55c in which a semi-transmissive film having a low transmittance is provided, and light-shielding areas 55d in which a light-shielding film which does not transmit light is provided. As a result, the intensity of the light passing through the photo mask 55 is at three levels.

Specifically, the area corresponding to the formation area of the channel part 2a of the TFT 201 is the first semi-transmissive area 55b, the part corresponding to the pixel electrode 8 is the second semi-transmissive area 55c, the parts corresponding to the formation areas of the source electrode 3, the drain electrode 4, the source line 31, and the source terminal 32 are the light-shielding areas 55d, and the other areas are the transmissive areas 55a.

When the photoresist 54 is exposed by using such photo mask 55 and when development is performed with an organic alkaline-based developer liquid containing tetramethylammonium hydroxide (TMAH), in the areas which is exposed through the transmissive areas 55a of the photo mask 55, the photoresist 54 is removed, but in the area having been masked by the first semi-transmissive area 55b, the second semi-transmissive area 55c, and the light-shielding areas 55d, the photoresist 54 having different thicknesses depending on the intensity of the transmitted light are left.

Figure 6:
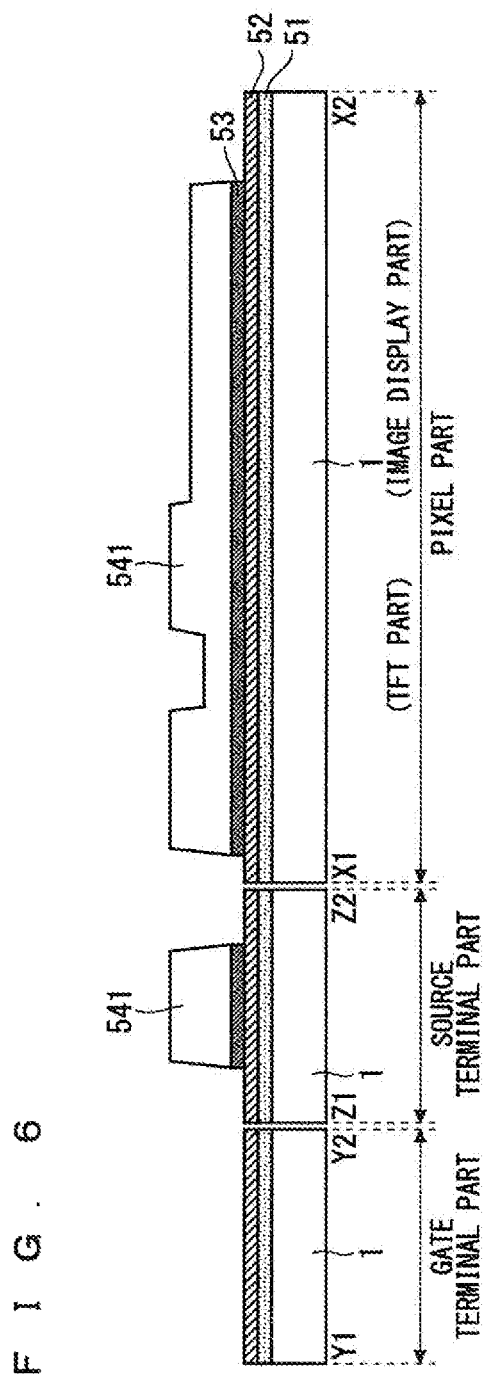

As a result, the photoresist 54 is processed into photoresist patterns 541 having three different thicknesses as shown in FIG. 6. Specifically, the photoresist patterns 541 have thin first parts which cover the formation area of the channel part 2a of the TFT 201, a second part which is thicker than the first part and covers the formation area of the pixel electrode 8, and third parts which are thicker than the second part and cover the formation areas of the source electrode 3, the drain electrode 4, the source line 31, and the source terminal 32. In the present preferred embodiment, the thickness of the first part, which is the thinnest in the photoresist patterns 541, is made to be approximately 0.5 μm.

Further, since the Al-3 mol % Ni alloy film used for first metal film 53 in the present preferred embodiment is soluble in the organic alkaline-based developer liquid for developing the photoresist patterns 541, the first metal film 53 which is not covered by the photoresist patterns 541 is removed when the photoresist patterns 541 are developed (FIG. 6). In other words, the development of the photoresist patterns 541 and the etching of the first metal film 53 by using the photoresist patterns 541 as a mask can be concurrently performed.

For example, when an alkaline solution of a TMAH concentration of 2.4 wt % at room temperature (23° C.) is used as the developer liquid, the Al-3 mol % Ni alloy film is etched at a speed of approximately 0.5 nm/sec. Thus, by extending the developing time by 400 seconds or more after the development of the photoresist patterns 541 is finished, the Al-3 mol % Ni alloy film of the thickness 200 nm can be removed by etching. In this manner, by using the developer liquid for the photoresist patterns 541 as an etchant for the first metal film 53, the production process can be simplified.

As disclosed in Japanese Patent Application Laid-Open No. 2008-72011, since various types of oxide semiconductors are very soluble in acid solution, it is impossible to selectively etch between the oxide semiconductor film 51 and the first metal film 53 (Al-3 mol % Ni alloy film) by using acid solution. For this reason, it would be very difficult to precisely pattern the laminated film including the oxide semiconductor film 51 and the first metal film 53. However, by making use of the fact that the oxide semiconductor is not soluble in alkaline solution such as TMAH, and by etching the first metal film 53 in an organic alkaline-based developer liquid as described above, only the first metal film 53 can be removed by etching without etching the oxide semiconductor film 51. Thus, the processing accuracy of a pattern can be improved.

Further, if the oxide semiconductor is laminated with or in contact with Al-based metal, battery reaction occurs, during development of a photoresist by using an organic alkaline developer liquid, in the developer liquid with the both films functioning as electrodes; thus, the Al-based metal is corroded by oxidation, and the oxide semiconductor is corroded by reduction, thereby creating a problem that defective patterns are generated. In contrast, when Al-3 mol % Ni alloy, in which Al is added to Ni, is used for the first metal film 53 as in the present preferred embodiment and when an alkaline developer liquid is used to etch and remove the Al-3 mol % Ni alloy, the battery reaction can be prevented. As a result, selective etching can be successfully performed, avoiding the corrosion by reduction of the oxide semiconductor film 51.

Figure 7:
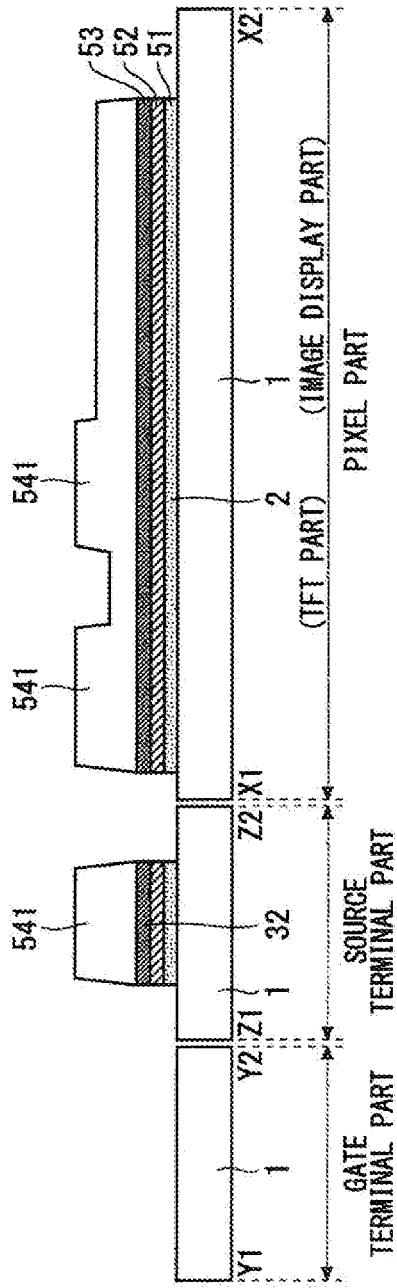

Next, as shown in FIG. 7, by using the photoresist patterns 541 as a mask, the first transparent conductive film 52 and the oxide semiconductor film 51 are collectively removed by etching. In this etching process, an aqueous solution with an oxalic acid concentration of 5 wt % is used. In this case, the oxide semiconductor film 51 is removed by etching at a speed of approximately 1 nm/sec at a room temperature (23° C.). The Al-3 mol % Ni alloy is solved neither in oxalic acid aqueous solution nor in the general oxalic acid solution. Thus, only the first transparent conductive film 52 and the oxide semiconductor film 51 can be selectively etched without etching the first metal film 53. As a result, the processing accuracy of a pattern can be improved.

Figure 8:
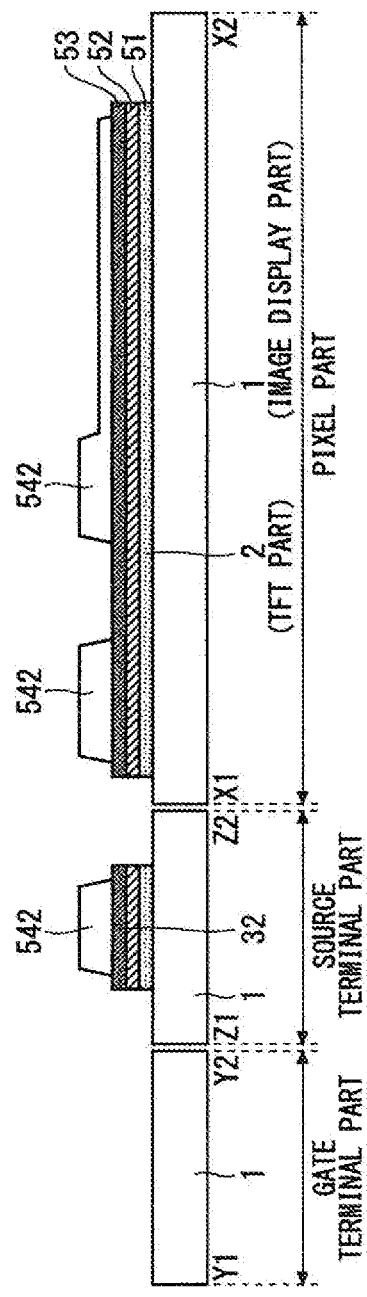

Then, the surface of the substrate 1 is subjected to photoresist ashing using oxygen gas plasma to reduce the thicknesses of the photoresist patterns 541. In the photoresist ashing, the first part (the part corresponding to the channel part 2a of the TFT 201), which is the thinnest in the photoresist patterns 541, is removed, and the other parts are left, which include the second part (the part corresponding to the pixel electrode 8) and the third parts (the parts corresponding to the source electrode 3, the drain electrode 4, the source line 31, and the source terminal 32). That is, the photoresist patterns 541 are processed into photoresist patterns 542 having two different thicknesses as shown in FIG. 8.

Figure 9:
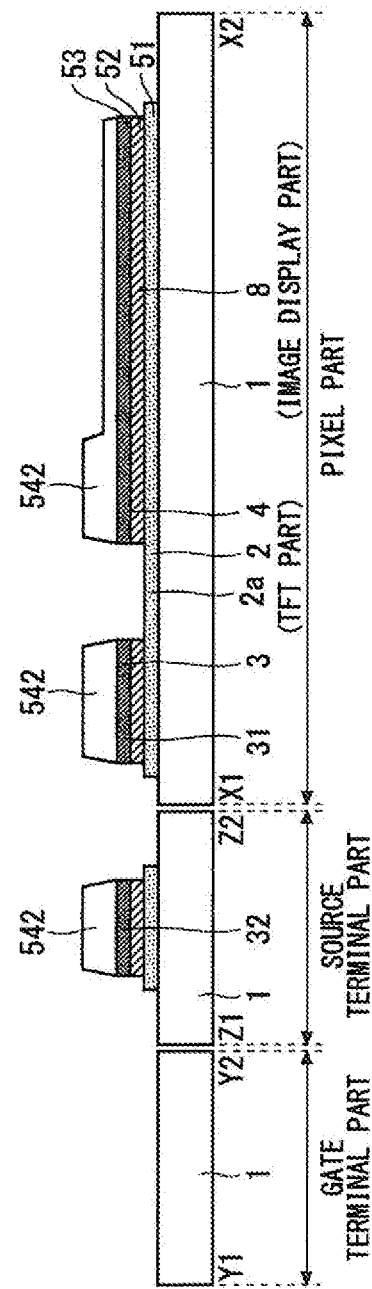

Then, by using the photoresist patterns 542 as a mask, the first metal film 53 and the first transparent conductive film 52 will be removed by etching. This process is performed as follows. First, the first metal film 53 is etched by using alkaline developer liquid with a TMAH concentration of 2.4 wt %; and subsequently, the first transparent conductive film 52 is etched by using, for example, a PAN-based etchant (mixed liquid of phosphoric acid, nitric acid, and acetic acid). As a result, as shown in FIG. 9, the part of the semiconductor film 2 which will become the channel part 2a of the TFT 201 is exposed. This process forms the patterns of the source electrode 3, the drain electrode 4, the pixel electrode 8, the source line 31, and the source terminal 32. However, the upper surface of the pixel electrode 8 is covered by the first metal film 53.

Here, the first metal film 53 and the first transparent conductive film 52 are removed by etching with different types of chemical liquid; however, the first metal film 53 and the first transparent conductive film 52 may be collectively etched. For example, if a laminated structure of Mo/Al/Mo is used as the first metal film 53, the first metal film 53 and the first transparent conductive film 52 can be collectively etched with PAN-based etchant. In this case, for the oxide semiconductor film 51, it is preferable to use materials resistant to PAN-based etchant such as In—Zn—Sn—O-based oxide semiconductor in which indium oxide ($In_2O_3$) and tin oxide ($SnO_2$) are added to zinc oxide (ZnO) and such as In—Ga—Zn—Sn—O-based oxide semiconductor disclosed in above Japanese Patent Application Laid-Open No. 2010-118407.

Alternatively, if material not resistant to the PAN-based etchant (for example, an IGZO film) is used for the oxide semiconductor film 51, it is preferable to use Cu for the first metal film 53 and to use ammonium persulfate for removing the first metal film 53 by etching. Since the ammonium persulfate does not etch non-crystal ITO or IZO constituting the first transparent conductive film 52 or the oxide semiconductor film 51, only the first metal film 53 can be selectively etched.

Alternatively, the first transparent conductive film 52 may be processed by dry etching. Since dry etching has excellent etching uniformity within a substrate surface, it is possible to remove by etching the first transparent conductive film 52, leaving the oxide semiconductor film 51. In this case, in order to prevent the oxide semiconductor film 51 from disappearing, a film thickness of the oxide semiconductor film 51 is preferably set to 50 nm or thicker (preferably, 60 to 90 nm).

Figure 10:
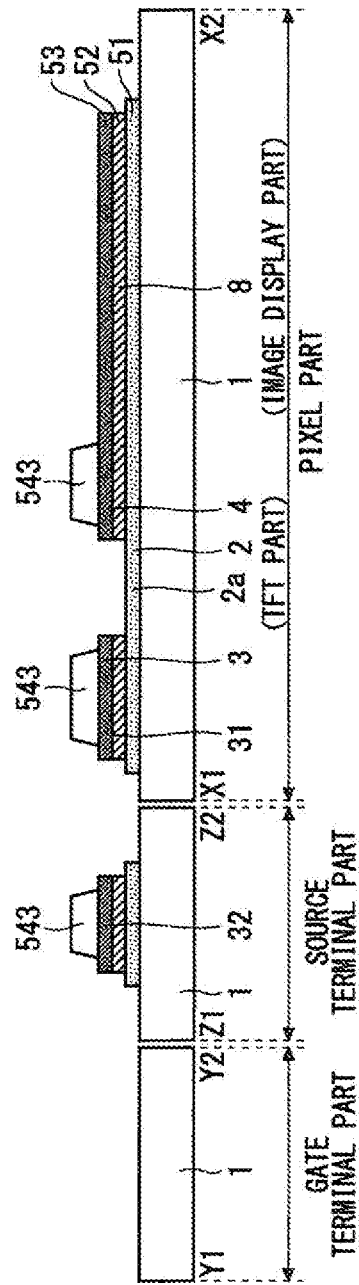

Next, the photoresist ashing is performed again to make the photoresist patterns 542 thinner In this photoresist ashing, the thinner part of the photoresist patterns 542 (corresponding to the second part of the photoresist patterns 541) is removed, and the thicker parts (corresponding to the third part of the photoresist patterns 541) are left. As a result, the photoresist pattern 542 is processed into photoresist patterns 543 having a uniform thickness as shown in FIG. 10. The photoresist patterns 543 cover the formation areas of the source electrode 3, the drain electrode 4, the source line 31, and the source terminal 32.

Figure 11:
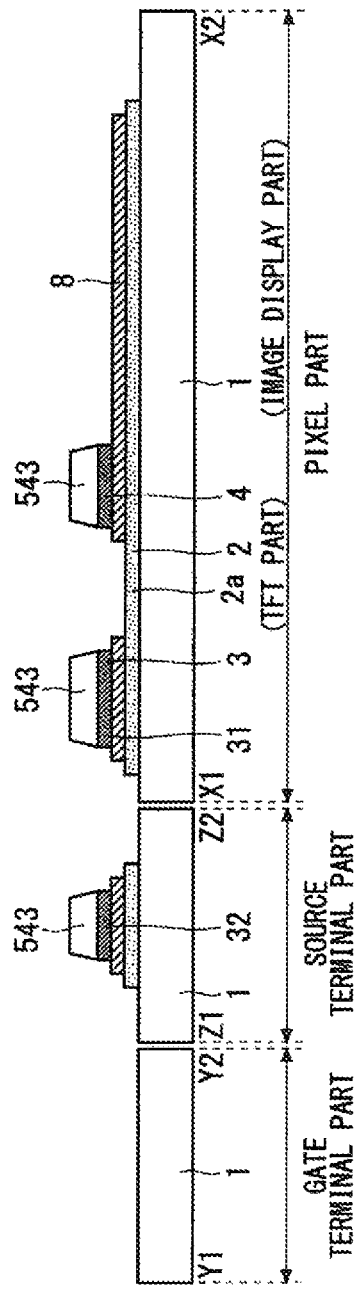

Then photoresist pattern 543 is used as a mask to remove by etching the first metal film 53. This etching can be performed with alkaline developer liquid having a TMAH concentration of 2.4 wt %. As a result, as shown in FIG. 11, the first metal film 53 on the pixel electrode 8 is removed, and the upper surface of the pixel electrode 8 is exposed.

If Cu is used for the first metal film 53, the first metal film 53 may be etched with ammonium persulfate. As described above, since ammonium persulfate does not etch non-crystal ITO or IZO constituting the first transparent conductive film 52 and does not etch the oxide semiconductor film 51, only the first metal film 53 can be selectively etched.

Alternatively, if non-crystal ITO is used for the first transparent conductive film 52, thermal treatment at the temperature of 120 to 150° C. can be added before etching the first metal film 53 (the state of FIG. 10). Since non-crystal ITO starts to crystallize at 120 to 150° C., this thermal treatment improves the resistivity of the ITO against chemical liquid and thus the resistivity of the first transparent conductive film 52 against the etching of the first metal film 53. However, if the temperature of the thermal treatment exceeds 150° C., the photoresist degenerates and the sticking force with the first metal film 53 decreases. For this reason, the temperature of the thermal treatment is preferably approximately 140° C.

Figure 12:
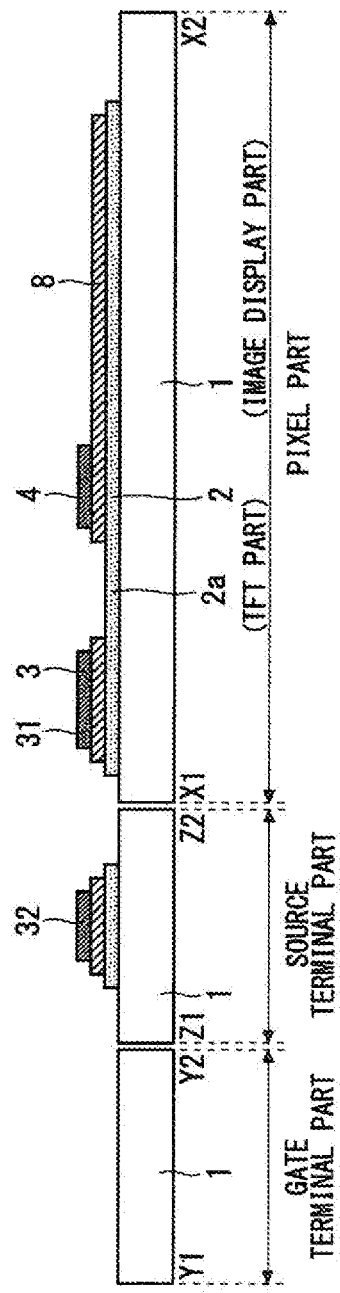

Then, by using amine-based photoresist stripping liquid, the photoresist patterns 542 is removed by stripping. As a result, as shown in FIG. 12, on the substrate 1 are formed the patterns of the semiconductor film 2 (including the channel part 2a), the source electrode 3, and the drain electrode 4 in addition to the pixel electrode 8, the source line 31, and the source terminal 32 connected to the TFT 201 which constitute the TFT 201. As described above, the source electrode 3, the drain electrode 4, the source line 31, and the source terminal 32 have a double-layer structure including the pixel electrode 8 of the same layer as the conductive film (first transparent conductive film 52) and the metal film (first metal film 53) thereon. Further, under the source line 31, the source terminal 32, and the pixel electrode 8, there is left the semiconductor film 2 of the same layer as the semiconductor layer (oxide semiconductor film 51). Further, a plane structure of the TFT substrate 200 at the state of FIG. 12 is shown in FIG. 20.

Next, the gate insulation film 5 is deposited on the whole surface of the substrate 1. In the present preferred embodiment, by using a chemical vapor deposition (CVD) method, under a substrate heating condition of approximately 250° C., a silicon nitride (SiN) film with a thickness of 300 nm is formed as the gate insulation film 5.

If oxide semiconductor is used for the semiconductor film 2, and if the gate insulation film 5 made of silicon nitride is used, hydrogen in the silicon nitride is defused into the semiconductor film 2, whereby electric characteristics (TFT characteristics) of the TFT 201 are sometimes deteriorated. To address this issue, in this case, the gate insulation film 5 may be made of a silicon oxide (SiO) film or a laminated film of silicon nitride and silicon oxide.

Figure 13:
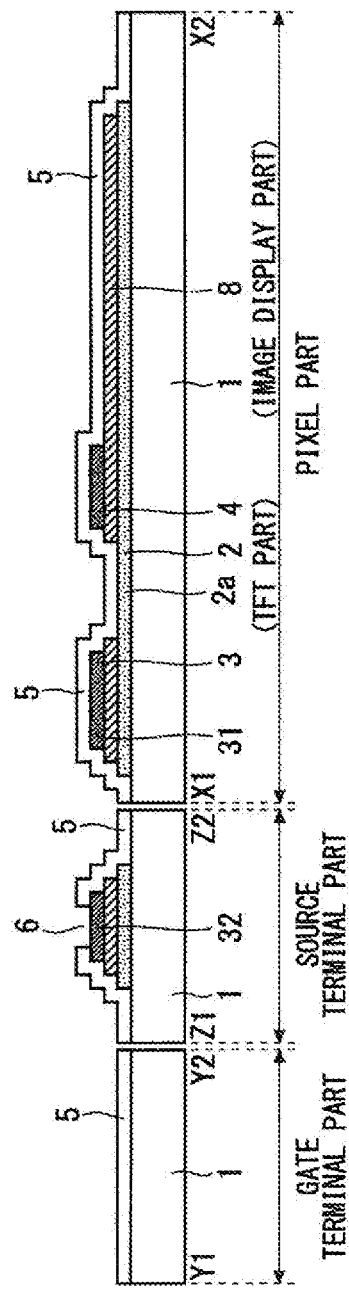

Then, through the second photolithography process, the photoresist is processed to form a photoresist pattern (not shown), and the photoresist pattern is then used as a mask to pattern the gate insulation film 5, whereby a contact hole 6 is formed on the source terminal 32 as shown in FIG. 13. If the gate insulation film 5 is made of silicon nitride, a dry etching method using fluorine-based gas can be used to etch the gate insulation film 5. Then the photoresist pattern is removed.

Figure 14:
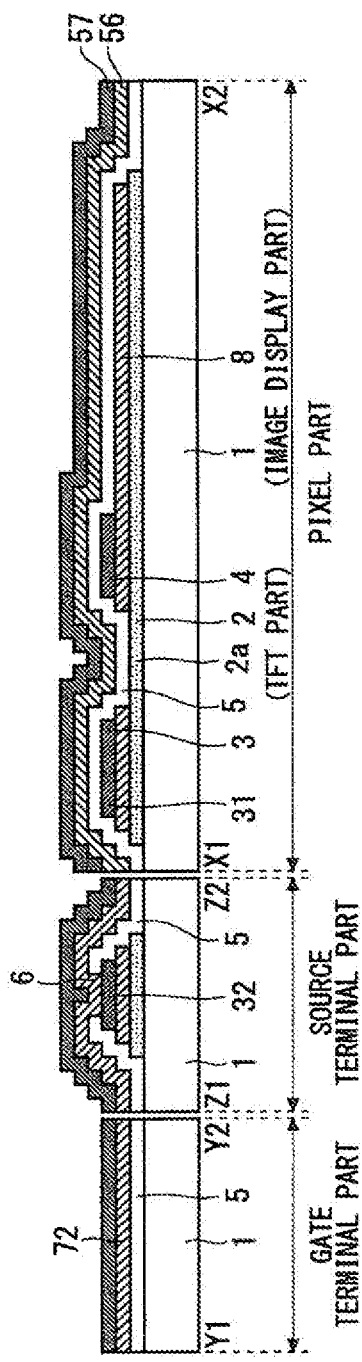

Subsequently, on the gate insulation film 5 including the inside of the contact hole 6, as shown in FIG. 14, there is formed a laminated film (second laminated film) in which the followings are laminated in this order: a second transparent conductive film 56 as material for the common electrode 9, the gate terminal 72 and source terminal pad 33; and a second metal film 57 as material for the gate electrode 7 and the gate line 71.

In present preferred embodiment, for the second transparent conductive film 56, ITO is used, and for the second metal film 57, Al—Ni alloy or Mo is used. The second transparent conductive film 56 and the second metal film 57 are deposited by the sputtering method using Ar gas. Here, as the second transparent conductive film 56, an ITO film with a thickness of 100 nm is formed, and as the second metal film 57, an Mo film with a thickness of 200 nm is formed.

Figure 15:
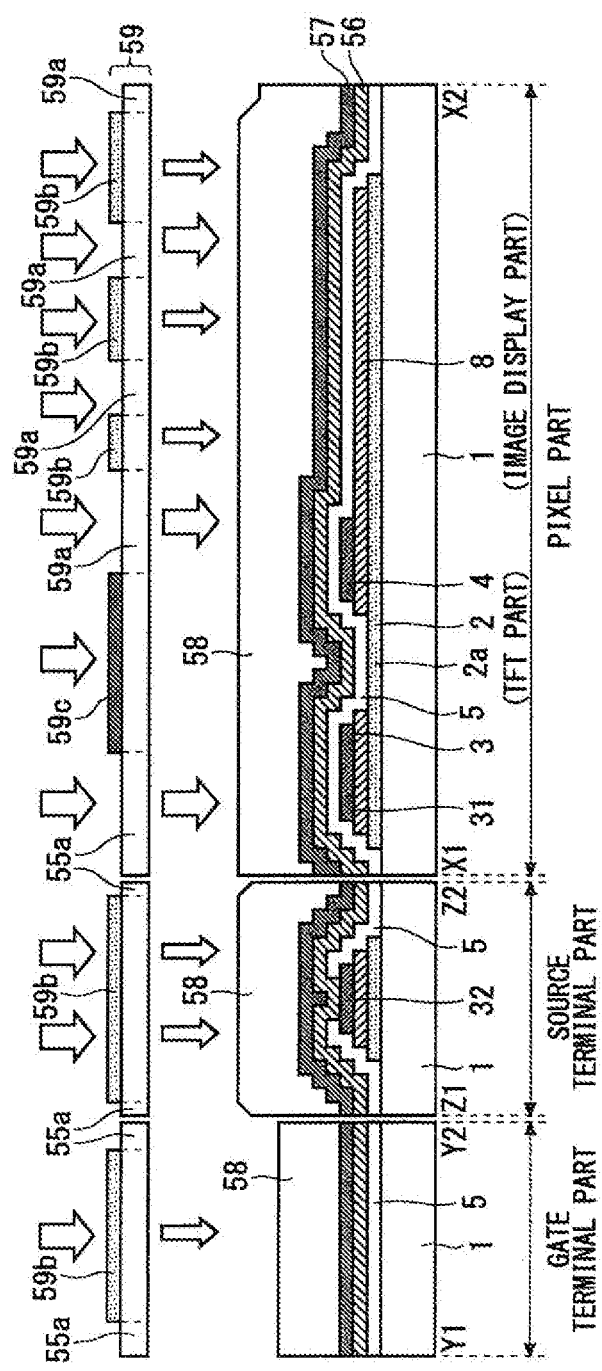

Subsequently, the third photolithography process is performed to form a photoresist pattern. First, a photoresist 58 is formed in a similar manner to the first photolithography process, and a photo mask 59 is then used to expose the photoresist 58 as shown in FIG. 15.

On the photo mask 59 formed is the light-shielding film corresponding to the patterns of the gate electrode 7, the common electrode 9, the gate line 71, the gate terminal 72, the source terminal pad 33, and the common line 91; and a part of the light-shielding film is a semi-transmissive film which reduces the intensity of the light for exposure. That is, the photo mask 59 has a transmissive area 59a in which no light-shielding film is provided, a semi-transmissive area 59b in which a semi-transmissive film is provided, and a light-shielding area 59c in which provided is a light-shielding film which does not transmit light. As a result, the intensity of the light passing through the photo mask 59 is at two levels.

Specifically, the areas corresponding to the formation areas of the common electrode 9, the gate terminal 72, the source terminal pad 33, and the common line 91 are the semi-transmissive area 59b; the parts corresponding to the formation area of the gate electrode 7 and the gate line 71 are light-shielding areas 59c; and the other areas are the transmissive areas 59a.

When the photo mask 59 is used to expose the photoresist 58 and when development is then performed, in the area which is exposed through the transmissive areas 59a of the photo mask 59, the photoresist 58 is removed, but in the area which is masked by the semi-transmissive areas 59b and the light-shielding areas 59c, the photoresist 58 having different thicknesses depending on the intensity of the transmitted light is left.

Figure 16:
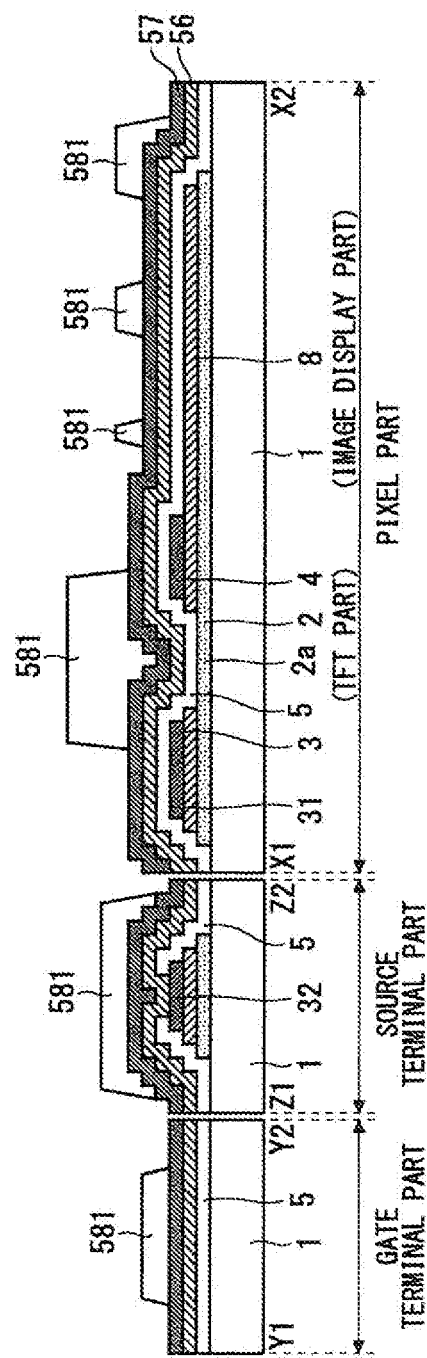

As a result the photoresist 58 is processed into photoresist patterns 581 having two different thicknesses as shown in FIG. 16. Specifically, the photoresist patterns 581 includes thin first parts which cover the formation areas of the common electrode 9, the gate terminal 72, the source terminal pad 33, and the common line 91 and a thick second part which covers the formation area of the gate electrode 7 and the gate line 71.

Figure 17:
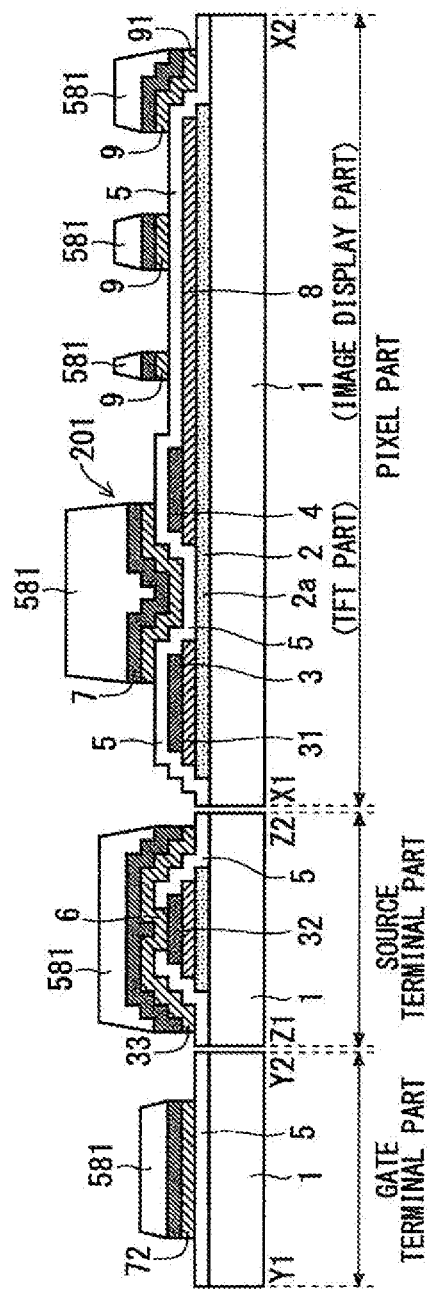

Next, etching is performed by using the photoresist patterns 581 as a mask to pattern the second metal film 57 and the second transparent conductive film 56. The second metal film 57 (Mo) can be removed with a PAN-based etchant, and the second transparent conductive film 56 (ITO) can be removed by wet etching with oxalic-acid-based solution. As a result, as shown in FIG. 17, the pattern of the gate electrode 7, the common electrode 9, the gate line 71 (not shown), the gate terminal 72, and the source terminal pad 33 is formed. However, the upper surfaces of the common electrode 9, the gate line 71, the source terminal pad 33, and the common line 91 are covered by the second metal film 57.

Figure 18:
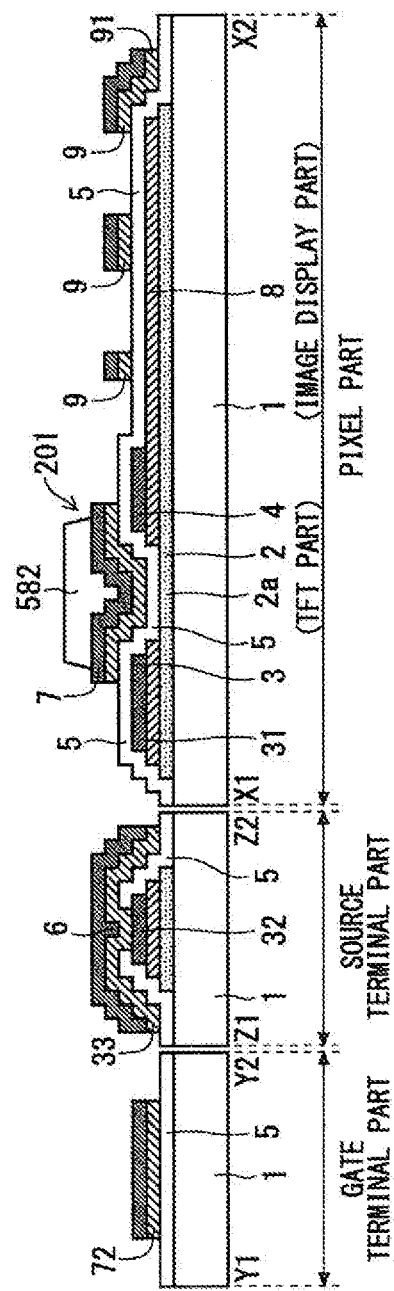

Then, photoresist ashing is performed to reduce the thickness of the photoresist patterns 581. In this photoresist ashing, only the first parts of the photoresist patterns 581 are removed, and only the second part is left. That is, the photoresist patterns 581 are processed into a photoresist pattern 582 as shown in FIG. 18. The photoresist pattern 582 covers the formation area of the gate electrode 7 and the gate line 71.

Figure 19:
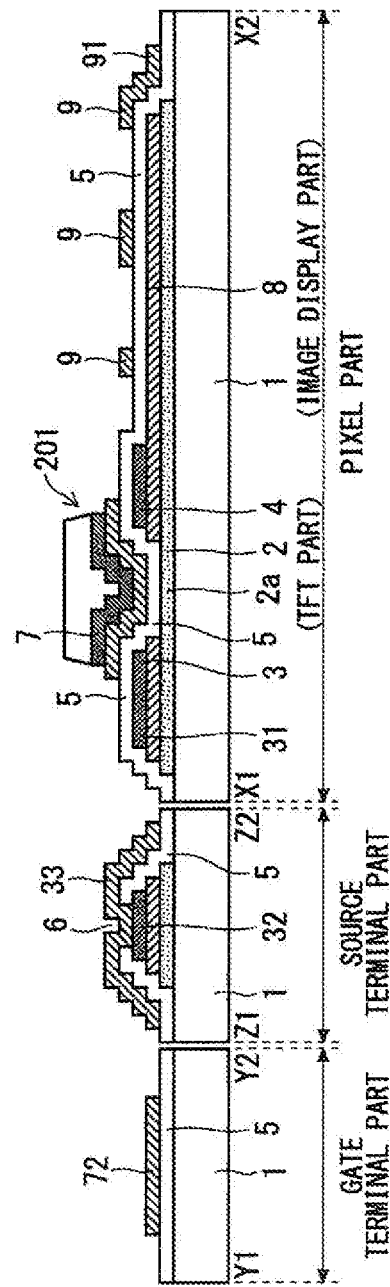
Figure 20:
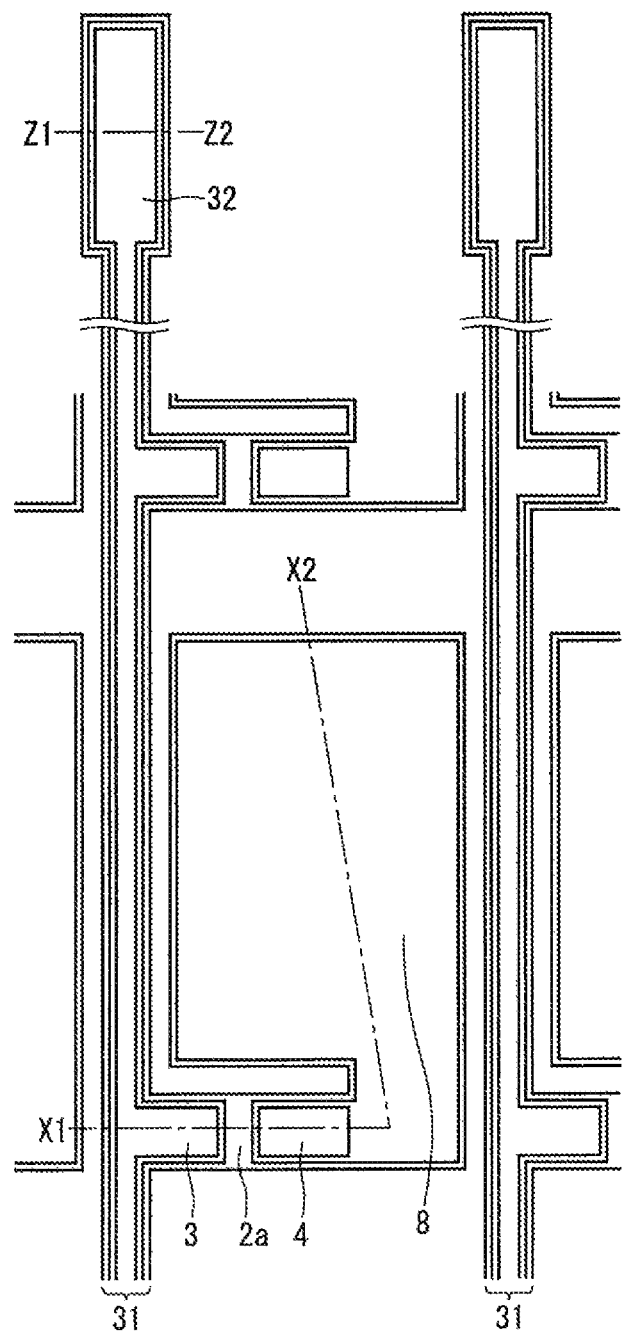
FIG. 20 is a plan view for describing the manufacturing method of the TFT substrate according to the first preferred embodiment.

Then, by using the photoresist pattern 582 as a mask, dry etching is performed to remove only the second metal film 57 and to leave the second transparent conductive film 56 as shown in FIG. 19. Through this process, the second metal film 57 which covered the common electrode 9, the gate line 71, the source terminal pad 33 and the common line 91 is removed, and the upper surfaces thereof are exposed. Since, on the gate electrode 7 and the gate line 71, the second metal film 57 is left, the gate electrode 7 and the gate line 71 have a double-layer structure which includes the conductive film of the same layer as the common electrode 9 and the metal film thereon.

In the present preferred embodiment, ITO is used for the second transparent conductive film 56; however, IZO (indium oxide $In_2O_3$+zinc oxide ZnO) may be used. In this case, as the second metal film 57, an Al-3 mol % Ni alloy film can be used similarly to the first metal film 53. The Al—Ni alloy can be selectively etched with respect to the second transparent conductive film 56 by using alkaline developer liquid with a TMAH concentration of 2.4 wt % as an etchant. Further, if Cu is used for the second metal film 57 and the ammonium persulfate is used as the etchant, selective etching with respect to the first metal film 53 made of IZO is possible.

Finally, the photoresist pattern 582 is removed to form the TFT substrate 200 having a structure shown in FIG. 2 and FIG. 3. As described above, the TFT substrate 200 of the present preferred embodiment can be formed only through three photolithography processes.

In assembling a liquid crystal display panel, an alignment film and spacers are formed on the completed TFT substrate 200. The alignment film is a film for aligning the liquid crystal and is constituted by polyimide and the like. In addition, a separately manufactured opposite substrate equipped with a color filter and an alignment film is laminated with the TFT substrate 200. In this process, a gap is created by the spacers between the TFT substrate 200 and the opposite substrate. In the gap, the liquid crystal is filled and sealed, whereby the liquid crystal display panel is formed. Finally, on the outer surface of the liquid crystal display panel, a polarization plate, a phase difference plate, and a backlight unit are disposed to complete the liquid crystal display device.

Since the TFT substrate 200 of the present preferred embodiment has the semiconductor film 2 constituting the TFT 201 disposed on the lowest layer, the light from the backlight unit directly enters the semiconductor film 2. If the semiconductor film 2 were made of Si, generated photo carriers might deteriorate an ON/OFF ratio of the TFT characteristics; however, in the present preferred embodiment, the semiconductor film 2 is made of oxide-based semiconductor, whereby the deterioration of the ON/OFF ratio of the TFT characteristics is reduced. As a result, the liquid crystal display device having a high display quality is realized which has a high contrast ratio and does not have any display non-uniformity. In addition, since the semiconductor film 2 made of oxide semiconductor is used, the mobility of the TFT 201 is high, whereby the TFT substrate 200 with a high operation speed is achieved.

Therefore, according to the present preferred embodiment, a TFT substrate 200 and a liquid crystal display device with a high performance can be manufactured with a high productivity. The present invention may be applied to TFT substrates used for display devices other than liquid crystal display devices. For example, the present invention is considered to be applied to electrooptical display devices such as organic EL (Electro-Luminescence) display devices. Of course, the present invention can be used for thin film transistors and TFT substrates which are used for semiconductor components other than display devices.

In the present preferred embodiment, as the first metal film 53, the Al-3 mol % Ni alloy film is used; however, the material for the first metal film 53 is not limited thereto. For example, an element to be added to Al is not limited to Ni, and may be palladium (Pd) or platinum (Pt), which belongs to the same X group in a periodic table. In addition, two or more of the Ni, Pd, and Pt may be added to Al. When these elements are added to Al, the first metal film 53 can be etched without corroding the IGZO film with alkaline solution (developer liquid) containing TMAH.

Further, the additive amount of Ni, Pd, Pt, or the like to Al is not limited to 3 mol %, and if the additive amount is 0.5 mol % or more, etching is possible with alkaline developer liquid containing TMAH. However, if the additive amount is greater than 10 mol %, a rate of precipitation of compound phases, of AlNi, AlPd, and AlPt, in the Al alloy film increases. The compound phases can be residue of etching in the process of etching with alkaline developer liquid and can cause defective etching. Therefore, the total additive amount of Ni, Pd, Pt, and the like to Al is preferably 0.5 mol % or more and 10 mol % or less. Within this range, an etching rate with the organic alkaline-based developer liquid is increased, and etching becomes easy.

The TMAH concentration in the TMAH solution is not limited to 2.4 wt %; however, the concentration is preferably in the range of 0.2 wt % or more and 25 wt % or less at the solution temperature of 10° C. to 50° C., for example. When the concentration of TMAH is less than 0.2 wt %, even with respect to the above-described Al alloy film, the etching rate is extremely low, and the etching is difficult. Alternatively, when the concentration of TMAH is 25 wt % or more, photoresist patterns get heavily damaged, and defective patterns are thus likely caused.

In the first metal film 53, N atoms or O atoms may be added to Al in the vicinity of a contact surface with the first transparent conductive film 52. For example, by performing reactive sputtering with a mixed gas in which $N_2$ gas or $O_2$ gas is added to Ar gas, N atoms or O atoms can be added to the Al alloy film. The additive amount of N atoms or O atoms can be controlled by adjusting the partial pressure of the $N_2$ gas or the $O_2$ gas.

It is preferable that the additive amount of N atoms and O atoms is in such a range that the Al alloy film has conductivity. Considering, as a standard, resistibility values of Ti, Cr, Mo, Ta, and W and alloy films of these elements as a common electrode material, in order to set the resistivity value to 200 μΩcm or less, for example, the additive amount of N atoms shall be 40 at % or less, or the additive amount of O atoms shall be 15 at % or less. Alternatively, both N atoms and O atoms may be added to a certain amount in such a range that the resistivity value does not exceed 200 μΩcm. To the above-described Al alloy containing Ni, Pd, or Pt, N atoms or O atoms may be further added.

As described above, when the contact surface of the first metal film 53 with the first transparent conductive film 52 is made of Al alloy containing N atoms or O atoms, ohmic contact characteristics between the first transparent conductive film 52 and the first metal film 53 can be excellent. In addition, with this technique, the contact characteristics between the first metal film 53 and the second metal film 57 thereon (for example, the contact characteristics of the source terminal 32 and the source terminal pad 33) made of an IZO layer or the like can also be excellent. Thus, the electric characteristics of the TFT 201 are improved, and display characteristics of the pixels are thus improved.

As described above, according to the present preferred embodiment, by using the semiconductor film 2 made of oxide semiconductor and the transparent pixel electrode 8 made of ITO, IZO, or the like, the transmissive TFT substrate 200 of the FFS type can be formed while the number of necessary photolithography process (in other words, the number of masks) is kept low.

Second Preferred Embodiment

In the first preferred embodiment, oxide semiconductor is used for the semiconductor film 2; however, if a low transmittance of the panel is not a problem, the conventional amorphous silicon film may be used for the semiconductor film 2.

Third Preferred Embodiment

In the first preferred embodiment, the described example is the transmissive TFT substrate 200 in which the whole part of the pixel electrode 8 is made transmissive; however, a semi-transmissive TFT substrate 200 can be manufactured in which the first metal film 53 is left in approximately a half area on the pixel electrode 8.

In order to leave the first metal film 53 on a half part on the pixel electrode 8, in the exposure process of the photoresist 54 shown in FIG. 5, the pattern of the second semi-transmissive area 55c and the light-shielding area 55d of the photo mask 55 can be modified. Specifically, a half of the area corresponding to the formation area of the pixel electrode 8 can be made to be the second semi-transmissive area 55c, and the other half can be made to be the light-shielding area 55d. With this arrangement, after the etching process of the first metal film 53 show in FIG. 11, the first metal film 53 will be left in a half area on the pixel electrode 8.

Note that the area on the pixel electrode 8 in which the first metal film 53 is left is not limited to the half of the whole pixel electrode 8. By adjusting the area on the pixel electrode 8 in which the first metal film 53 is left, a ratio of the transmitted light and the reflected light can be arbitrarily set.

Fourth Preferred Embodiment

As described in the third preferred embodiment, in the exposure process of the photoresist 54 shown in FIG. 5, depending on the patterns of the second semi-transmissive area 55c and the light-shielding area 55d of the photo mask 55, the area on the pixel electrode 8 in which the first metal film 53 is left can be determined. For example, if the second semi-transmissive area 55c is not provided on the photo mask 55 in FIG. 5, and if the first metal film 53 is left on the whole of the pixel electrode 8, a reflection type TFT substrate 200 of the FFS type can be manufactured.

In the case that the first metal film 53 is left on the whole of the pixel electrode 8, the pixel electrode 8 does not have to be transmissive, and an opaque conductive film such as metal may be used instead of the first transparent conductive film 52.

Alternatively, the first transparent conductive film 52 may not be provided. In this case, the source electrode 3, the drain electrode 4, the pixel electrode 8, the source line 31, and the source terminal 32 all have a single-layer structure constituted by the first metal film 53.

Fifth Preferred Embodiment

In the TFT substrate 200 of the present invention, if material such as ITO and IZO, which has a relatively high resistance, is used for the second transparent conductive film 56, which is material for the common electrode 9 and the common line 91, and especially if a large-scale display panel is configured, there is possibility that the potentials on the common electrodes 9 corresponding to the pixels vary due to the voltage drop on the common line 91, whereby the display quality is deteriorated. In the fifth preferred embodiment, in order to prevent this problem from occurring, redundant lines are provided in parallel to the common lines 91 to reduce the resistance of paths for supplying common potential to the common electrodes 9.

Figure 21:
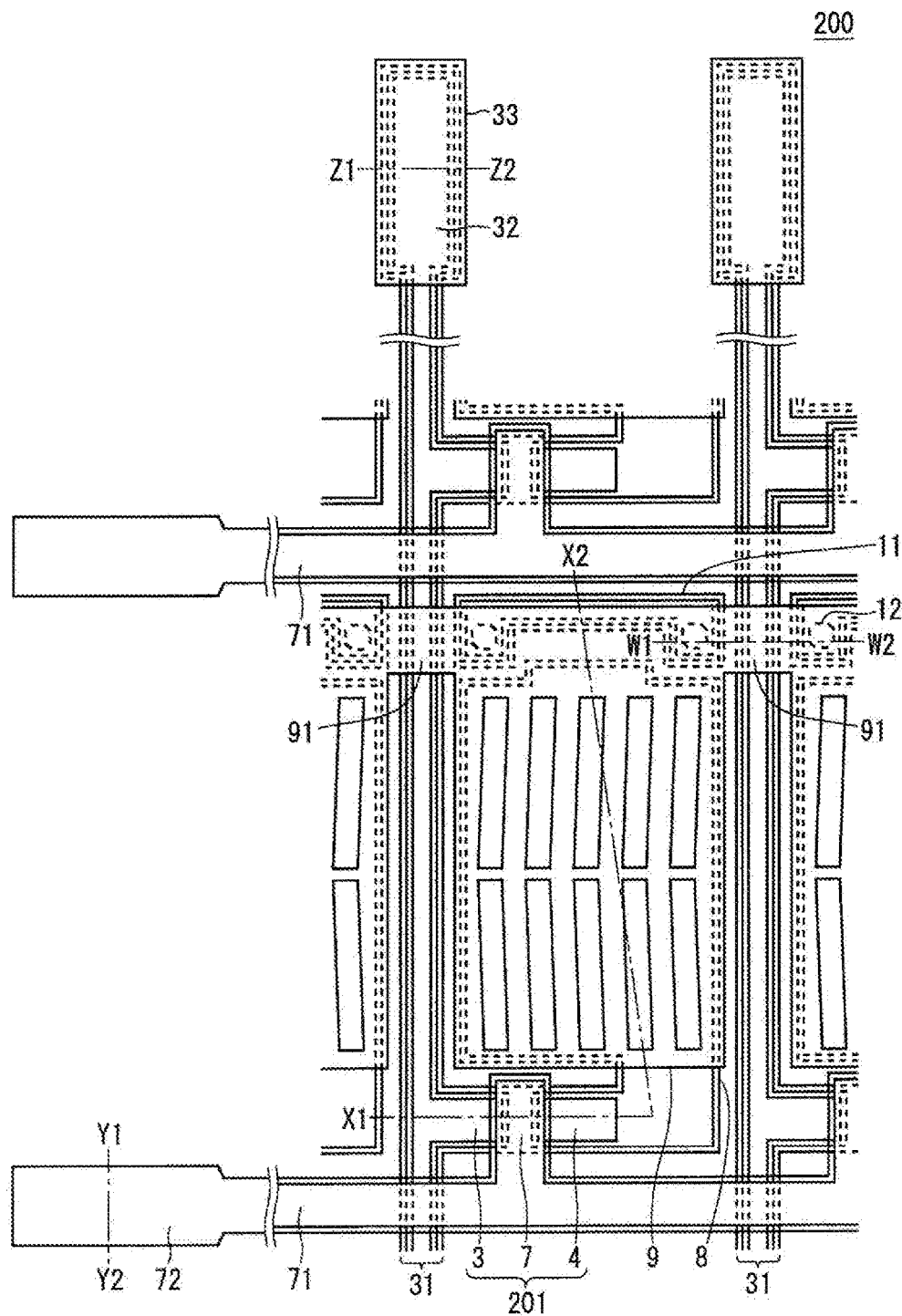
FIG. 21 is a plan view of a TFT substrate according to a fifth preferred embodiment.
Figure 22:
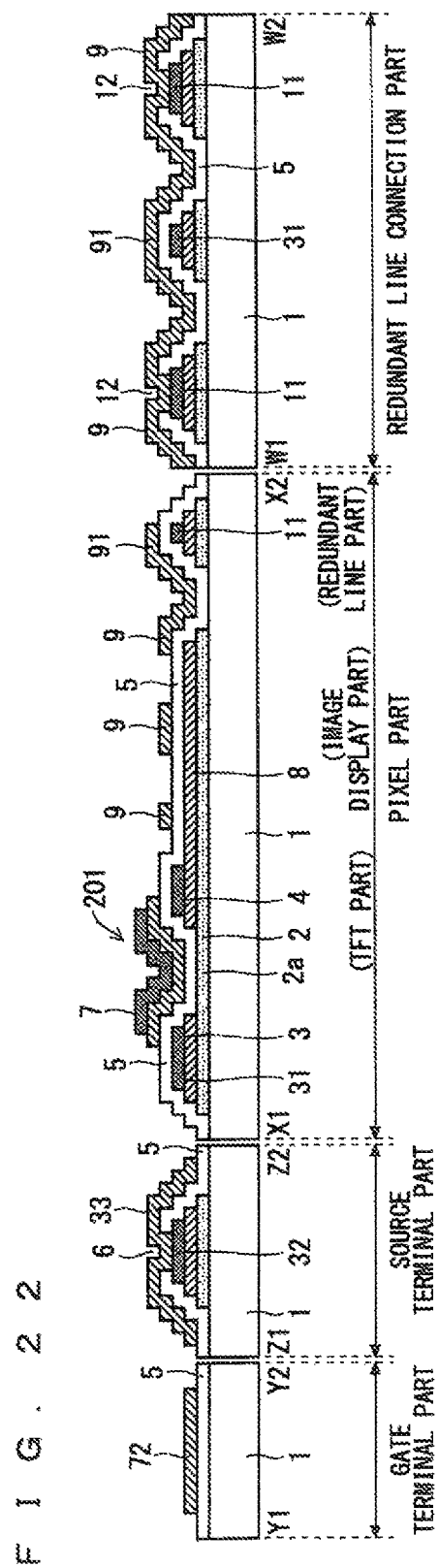
FIG. 22 is a cross sectional view of a TFT substrate according to the fifth preferred embodiment.

FIG. 21 and FIG. 22 are diagrams showing a configuration of a TFT substrate 200 according to the fifth preferred embodiment. FIG. 21 shows a plane structure of the main part including the pixel 204 of the TFT substrate 200, and FIG. 22 shows a cross sectional structure thereof. FIG. 22 shows cross sections corresponding to line X1-X2, line Y1-Y2, line Z1-Z2, and line W1-W2 shown in FIG. 21. Similarly to FIG. 3, the cross sections along line X1-X2, line Y1-Y2, and line Z1-Z2 correspond to a pixel part, a gate terminal part, and a source terminal part, respectively; however, the cross section along line X1-X2 includes a formation area (redundant line part) of a redundant common line 11 of the redundant line of the common electrode 9. Further, the cross section along line W1-W2 corresponds to a connection parts (redundant line connection part) of the common line 91 and the redundant common lines 11.

In the present preferred embodiment, the redundant common line 11 connected to the common line 91 is formed of a conductive film of the same layer as the source line 31 (a first transparent conductive film 52 and a first metal film 53). Further, similarly to the source line 31, also under the redundant common line 11, the semiconductor layer of the same layer as the semiconductor film 2 is left. As shown in FIG. 21, the redundant common line 11 extends in parallel to the gate line 71 and is connected to the common electrodes 9 through contact holes 12 formed in the gate insulation film 5 in the vicinities of the left and right ends of the common electrode 9.

Since the redundant common line 11 is of the same layer as the source line 31 and cannot three-dimensionally cross the source line 31, the redundant common line 11 is divided by the source line 31. However, as shown in FIG. 22, the redundant common lines 11 in the adjacent pixels are electrically connected through the common line 91 of the same layer as the common electrode 9.

As described above, since the redundant common line 11 is parallel-connected to the common line 91, the resistance of the path for supplying the common potential to the common electrode 9 is reduced. Thus, the variation of the potentials on the common electrodes 9 corresponding to the pixels are reduced, and even if a large-scale display panel is configured, the display quality is prevented from being deteriorated.

Figure 23:
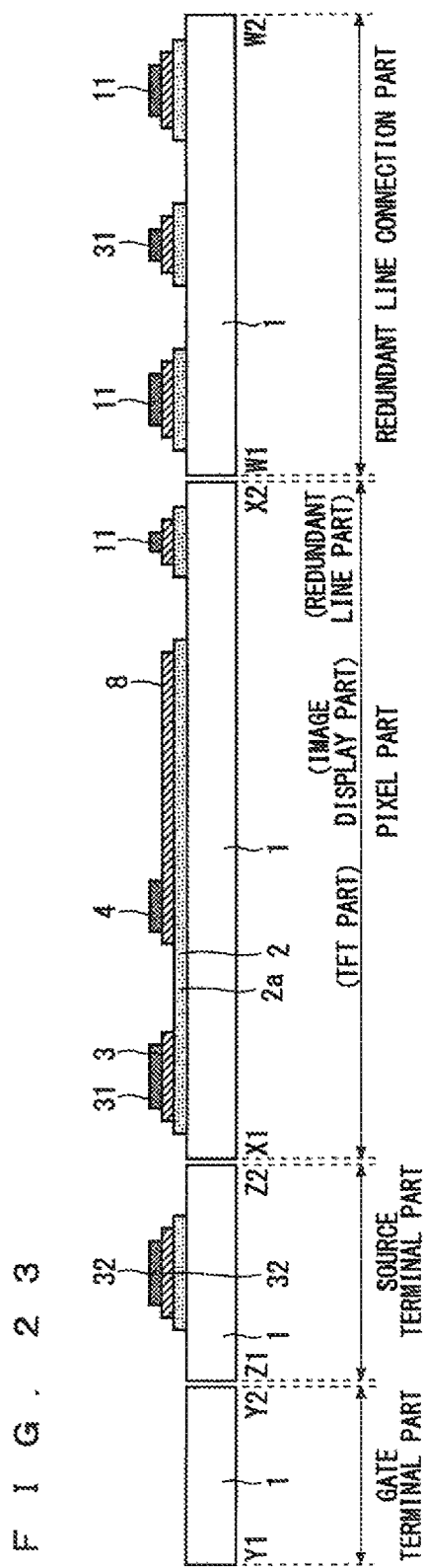
FIGS. 23 and 24 are views showing a process of a manufacturing method of the TFT substrate according to the fifth preferred embodiment.

The TFT substrate 200 of the present preferred embodiment can be manufactured in a manufacturing method similar to that used in the first preferred embodiment. That is, in the process in which the laminated film (first laminated film) constituted by the oxide semiconductor film 51, the first transparent conductive film 52, and the first metal film 53 is patterned to form the source line 31 and the like (FIG. 4 to FIG. 12), if the pattern of the redundant common line 11 constituted by the oxide semiconductor film 51, the first transparent conductive film 52, and the first metal film 53 is formed as shown in FIG. 23, the redundant common line 11 is formed without increasing the number of processes. Specifically, the light-shielding area 55d of the photo mask 55 shown in FIG. 5 has only to be added in the formation area of the redundant common line 11.

Figure 24:
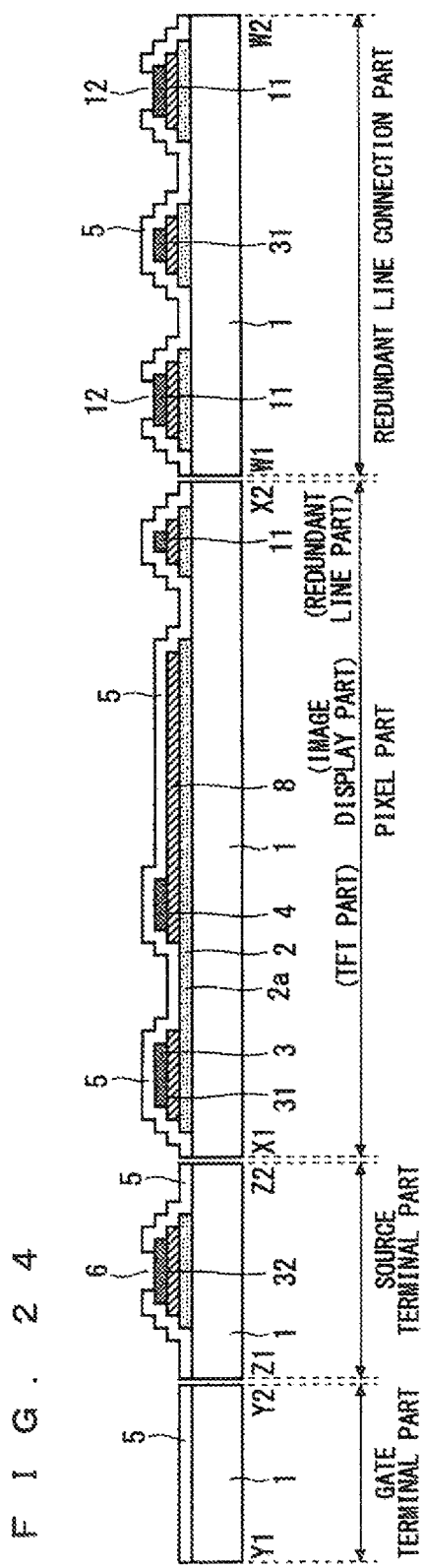

Further, in the process of forming the contact hole 6 in the gate insulation film 5 (FIG. 13), by removing by simultaneously etching the gate insulation film 5 on the redundant common line 11 as shown in FIG. 24, the contact hole 12 can be formed.

Lastly, in the process of patterning the second transparent conductive film 56 and the second metal film 57 to form the gate electrode 7, the common electrode 9, and the common line 91 (FIG. 14 to FIG. 19), the contact hole 12 is filled with the common electrode 9 or a part of the common line 91, and the structure shown in FIG. 21 and FIG. 22 is thus obtained. Specifically, on the photo mask 59 shown in FIG. 15, the semi-transmissive area 59b corresponding to the common electrode 9 or the common line 91 has only to be provided to overlap the contact hole 12.

Sixth Preferred Embodiment

Also in a sixth preferred embodiment, there is described a structure for reducing the resistance of a path for supplying the common potential to the common electrodes 9.

Figure 25:
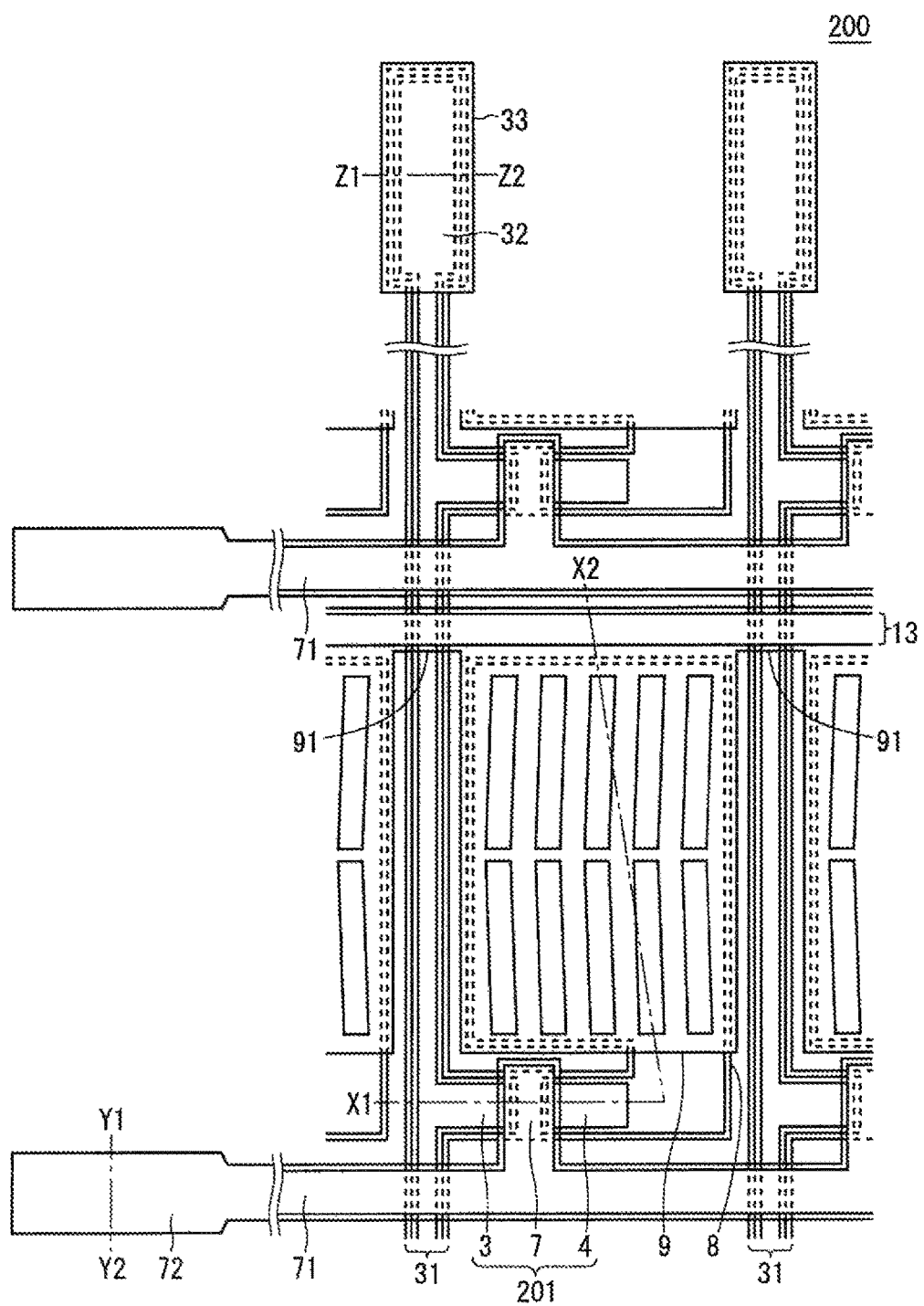
FIG. 25 is a plan view of a TFT substrate according to a sixth preferred embodiment.

FIG. 25 and FIG. 26 are diagrams showing a structure of a TFT substrate 200 according to the sixth preferred embodiment. FIG. 25 shows a plane structure of the main part including the pixel 204 of the TFT substrate 200, and FIG. 26 shows a cross sectional structure thereof. FIG. 26 shows the cross sections corresponding to line X1-X2, line Y1-Y2, and line Z1-Z2 shown in FIG. 25. Similarly to FIG. 3, the cross sections along line X1-X2, line Y1-Y2, and line Z1-Z2 correspond to the pixel part, the gate terminal part, and the source terminal part, respectively; however, the cross section along line X1-X2 includes a formation area (redundant line part) of a redundant common line 13 as a redundant line of the common electrode 9.

The redundant common line 13 is a metal film provided, on the common line 91, parallel to the gate line 71. In other words, the common line 91 has, similarly to the gate electrode 7, a double-layer structure including the conductive film of the same layer as the common electrode 9 and the metal film thereon.

The redundant common line 13 is formed by using the second metal film 57, similarly to the metal film of the upper layer on the gate electrode 7. Thus, the redundant common line 13 can be formed by leaving the second metal film 57 on the common line 91 in the process of patterning the second transparent conductive film 56 and the second metal film 57 to form the gate electrode 7, the common electrode 9, and the common line 91 (FIG. 14 to FIG. 19). Specifically, on the photo mask 59 shown in FIG. 15, the area corresponding to the common line 91 can be filled with the light-shielding area 59c instead of the semi-transmissive area 59b.

Since the redundant common line 13 provided on the common line 91 reduces the resistance of the path for supplying the common potential to the common electrodes 9, a similar effect to the fifth preferred embodiment can be obtained. In addition, the redundant common line 13 of the present preferred embodiment can be combined with the redundant common line 11 of the same layer as the source line 31 shown in the fifth preferred embodiment, thereby yielding higher effect.

While the invention has been shown and described in detail, the foregoing description is in all aspects illustrative and not restrictive. It is therefore understood that numerous modifications and variations can be devised without departing from the scope of the invention.

What is claimed is:

1. A manufacturing method of an active matrix substrate equipped with a thin film transistor, a pixel electrode connected to a drain electrode of said thin film transistor, and a source line connected to a source electrode of said thin film transistor, the manufacturing method comprising the steps of:
   (a) forming on a substrate a first laminated film in which a semiconductor film comprising a transparent oxide semiconductor, a first transparent conductive film, and a first metal film are laminated in this order;
   (b) forming on said first laminated film a first photoresist pattern having a first part covering a formation area of a channel part of said thin film transistor, a second part which is thicker than said first part and covers a formation area of said pixel electrode, and a third part which is thicker than said second part and covers formation areas of said source electrode, said drain electrode, and said source line;
   (c) patterning said first metal film, said first transparent conductive film, and said semiconductor film by using said first photoresist pattern as a mask;
   (d) reducing, after said step (c), a thickness of said first photoresist pattern to remove said first part, and then patterning said first metal film and said first transparent conductive film by using a remainder of said first photoresist pattern as a mask; and
   (e) further reducing, after said step (d), a thickness of said first photoresist pattern to remove said second part, and then patterning said first metal film by using a remainder of said first photoresist pattern as a mask, wherein
   said active matrix substrate is further equipped with a source terminal connected to said source line, a gate line connected to a gate electrode of said thin film transistor, a gate terminal connected to said gate line, a common electrode disposed to face said pixel electrode, a source terminal pad provided on said source terminal, said third part also covers a formation area of said source terminal in said step (b), and the manufacturing method further comprises the steps of:
   (f) removing said third part of said first photoresist pattern, forming an insulation film on said substrate after removing said third part of said first photoresist pattern, and then forming a contact hole in said formation area of said source terminal in said insulation film;
   (g) forming on said insulation film including on an inside of said contact hole, a second laminated film in which a second transparent conductive film and a second metal film are laminated in this order;
   (h) forming on said second laminated film a second photoresist pattern which has a first part covering formation areas of said common electrode, said gate terminal, and said source terminal pad and which has a second part being thicker than said first part of said second photoresist pattern and covering formation areas of said gate electrode and said gate line;

(i) patterning said second metal film and said second transparent conductive film by using said second photoresist pattern as a mask; and (j) reducing, after said step (i), a thickness of said second photoresist pattern to remove said first part of said second photoresist pattern, and patterning said second metal film by using a remainder of said second photoresist pattern as a mask.

2. The manufacturing method of the active matrix substrate according to claim 1, wherein in said step (h), said formation area of said common electrode, covered by said first part of said second photoresist pattern has a comb shape having slits or a lattice shape, and said patterning of said second transparent conductive film in said step (i) forms said common electrode to have a comb shape having slits or a lattice shape.

3. The manufacturing method of the active matrix substrate according to claim 1, wherein said first metal film is made of an alloy of Al and Ni, and said patterning of said first metal film in said step (c) comprises removing said first metal film with an organic alkali-based developer liquid.

4. The manufacturing method of the active matrix substrate according to claim 3, wherein said organic alkali-based developer liquid for the removing said first metal film is the same as a developer liquid for the forming said first photoresist pattern in said step (b).

5. The manufacturing method of the active matrix substrate according to claim 1, wherein said patterning of said step (c) comprises etching said first metal film, and then etching said first transparent conductive film and said semiconductor film for collective removal.

6. The manufacturing method of the active matrix substrate according to claim 5, wherein said etching of said first transparent conductive film and said semiconductor film for the collective removal is performed using an oxalic acid solution.

7. A manufacturing method of an active matrix substrate equipped with a thin film transistor, said thin film transistor comprising a semiconductor film formed on a substrate, a source electrode and a drain electrode each formed on said semiconductor film and each comprising a first metal film and a first transparent conductive film, a channel part which is a part of said semiconductor film and is disposed between said source electrode and said drain electrode, an insulation film covering said source electrode, said drain electrode, and said channel part, and a gate electrode disposed above said channel part with said insulation film interposed therebetween and comprising a second metal film and a second transparent conductive film, the manufacturing method comprising the steps of:

(a) forming on said substrate a first laminated film in which said semiconductor film, comprising a transparent oxide semiconductor, said first transparent conductive film, and said first metal film are laminated in this order;

(b) a first patterning of said first metal film, said first transparent conductive film, and said semiconductor film;

(c) a second patterning, after said step (b), of said first metal film and said first transparent conductive film;

(d) a third patterning of said first metal film after said step (c);

(e) forming said insulation film on said substrate and then forming a contact hole in said insulation film;

(f) forming on said insulation film including on an inside of said contact hole, a second laminated film in which said second transparent conductive film and said second metal film are laminated in this order;

(g) a first patterning of said second metal film and said second transparent conductive film; and (h) a second patterning of said second metal film after said step (g), wherein said active matrix substrate is further equipped with a pixel electrode connected to said drain electrode of said thin film transistor and comprising said first transparent conductive film, a source line connected to said source electrode of said thin film transistor and comprising said first metal film and said first transparent conductive film, a source terminal connected to said source line and comprising said first metal film and said first transparent conductive film, a gate line connected to said gate electrode of said thin film transistor and comprising said second metal film and said second transparent conductive film, and a common electrode disposed above said pixel electrode with said insulation film interposed therebetween and comprising said second transparent conductive film, said insulation film covers said source line and said source terminal, said active matrix substrate is further equipped with a source terminal pad on said insulation film, said source terminal pad being connected to said source terminal through said contact hole and comprising said second transparent conductive film, and a semiconductor layer of the same layer level as said semiconductor film is disposed under said source line and said pixel electrode.

8. A manufacturing method of an active matrix substrate equipped with a thin film transistor, a pixel electrode connected to a drain electrode of said thin film transistor, and a source line connected to a source electrode of said thin film transistor, the manufacturing method comprising the steps of:

(a) forming on a substrate a first laminated film in which a semiconductor film comprising a transparent oxide semiconductor, a first transparent conductive film, and a first metal film are laminated in this order;

(b) forming on said first laminated film a first photoresist pattern covering a formation area of a channel part of said thin film transistor, a formation area of said pixel electrode, and formation areas of said source electrode, said drain electrode and said source line;

(c) patterning said first metal film, said first transparent conductive film, and said semiconductor film by using said first photoresist pattern as a mask;

(d) patterning, after said step (c), said first metal film and said first transparent conductive film by using, as a mask, a second photoresist pattern covering said formation area of said pixel electrode, and said formation areas of said source electrode, said drain electrode and said source line; and (e) patterning, after said step (d), said first metal film by using, as a mask, a third photoresist pattern covering said formation areas of said source electrode, said drain electrode and said source line, wherein said active matrix substrate is further equipped with a source terminal connected to said source line, a gate line connected to a gate electrode of said thin film transistor, a gate terminal connected to said gate line, a common electrode disposed to face said pixel electrode, a source terminal pad provided on said source terminal, and said first photoresist pattern, said second photoresist pattern, and said third photoresist pattern also cover a formation area of said source terminal, and the manufacturing method further comprises the steps of:

(f) removing said third photoresist pattern, forming an insulation film on said substrate after removing said third photoresist pattern, and then forming a contact hole in said formation area of said source terminal in said insulation film;

(g) forming on said insulation film including on an inside of said contact hole, a second laminated film in which a second transparent conductive film and a second metal film are laminated in this order;

(h) forming on said second laminated film a fourth photoresist pattern covering formation areas of said common electrode, said gate terminal and said source terminal pad, and formation areas of said gate electrode and said gate line;

(i) patterning said second metal film and said second transparent conductive film by using said fourth photoresist pattern as a mask; and (j) patterning, after said step (i), said second metal film by using, as a mask, a fifth photoresist pattern covering said formation areas of said gate electrode and said gate line.

9. The manufacturing method of the active matrix substrate according to claim 8, wherein said first metal film is made of an alloy of Al and Ni, and said patterning of said first metal film in said step (c) comprises removing said first metal film with an organic alkali-based developer liquid.

10. The manufacturing method of the active matrix substrate according to claim 9, wherein said organic alkali-based developer liquid for the removing said first metal film is the same as a developer liquid for the forming said first photoresist pattern in said step (b).

11. The manufacturing method of the active matrix substrate according to claim 8, wherein said patterning of said step (c) comprises etching said first metal film, and then etching said first transparent conductive film and said semiconductor film for collective removal.

12. The manufacturing method of the active matrix substrate according to claim 11, wherein said etching of said first transparent conductive film and said semiconductor film for the collective removal is performed using an oxalic acid solution.

* * * * *